United States Patent [19]

Shimotashiro et al.

[11] Patent Number: 5,361,043
[45] Date of Patent: Nov. 1, 1994

[54] DELAY CIRCUIT FOR CHANGEABLY DELAYING AN ANALOG SIGNAL

[75] Inventors: Masafumi Shimotashiro; Kouiti Hayashi; Yoshio Higashida; Kiyokazu Hashimoto, all of Osaka, Japan

[73] Assignee: Matsushita Electric Industrial Co., Ltd., Osaka, Japan

[21] Appl. No.: 47,519

[22] Filed: Apr. 19, 1993

[30] Foreign Application Priority Data

Apr. 30, 1992 [JP] Japan .................................. 4-111077

[51] Int. Cl.$^5$ ........................................... H03F 3/54
[52] U.S. Cl. .................................... 330/302; 330/304
[58] Field of Search ............... 330/302, 303, 304, 305, 330/306, 280, 281, 141

[56] References Cited

U.S. PATENT DOCUMENTS 3,800,265  3/1974  Yoshioka ............................. 330/304

FOREIGN PATENT DOCUMENTS 56-161711  12/1981  Japan .

OTHER PUBLICATIONS

Elektor vol. 1, No. 5, p. 720 Jul./Aug. 1975.
Elektor vol. 3, No. 2, p. 31 Feb. 1975.
"Design of an Operational Amplifier Circuit" by N. Fujii; Electronic Science Series–74; pp., 163–175; published Aug. 30, 1977 (w/partial English translation).

Primary Examiner—Steven Mottola
Assistant Examiner—Tiep H. Nguyen
Attorney, Agent, or Firm—Lowe, Price, LeBlanc & Becker

[57] ABSTRACT

A delay circuit is provided with an npn type of transistor of which a base is connected to an input terminal, a first constant current source through which a constant current flows from an emitter of the transistor to ground, a first capacitor arranged between the emitter of the transistor and an electric source terminal, a second capacitor $C_{22}$ arranged between a collector of the transistor and an output terminal, a first resistor arranged between the emitter of the transistor and the output terminal, a second resistor arranged between the collector of the transistor and the electric source terminal. The constant current of the constant current source is changeable, and an emitter resistance of the transistor is changed depending on the constant current. Therefore, an analog signal applied to the input terminal is changeably delayed by coaction of the resistors, the capacitors and the emitter resistance adjusted by changing the constant current of the constant current source.

32 Claims, 13 Drawing Sheets

DELAY CIRCUIT FOR CHANGEABLY DELAYING AN ANALOG SIGNAL

BACKGROUND OF THE INVENTION

1. Field Of The Invention

The present invention relates generally to a delay circuit for delaying analog signals, and more particularly to a delay circuit provided with one or more semiconductor devices arranged in a large scale integrated circuit.

2. Description Of The Related Art

A phase shifter has been utilized as a conventional delay circuit in which analog signals ranging over all bands are delayed without decreasing the amplitude of the analog signals. The phase shifter is generally provided with constructional elements such as a plurality of operational amplifiers, a plurality of resistors, a plurality of capacitors, and the like. The constructional elements are integrated on a large scale. For a detailed description on the conventional delay circuit, see Japanese Patent Application No. 65749 of 1980 laid open to public inspection on Dec. 12, 1981 under Provisional Publication no. 161711/81, and N. Fujii, 37 Design of Operational Amplifier", a series of Electro-Science 74, published by Sanpoo in Japan.

The operational amplifiers in the conventional delay shifter is important to delay the analog signals. Also, three of more transistors are connected to each other in series between an electric source terminal and ground in the conventional delay shifter to change frequency characteristics of the amplitude of the analog signals in dependence on the frequency of the analog signals.

Therefore, the transistors arranged in series can not be operated on condition that an electric potential of the electric source terminal is equal to or less than 3 V. In other words, an electric potential range (or, a dynamic range) allowed for the analog signals is not enough to delay the analog signals in the conventional delay shifter. Also, noise generated in the conventional delay shifter is amplified in a series of transistors.

Accordingly, in cases where the electric potential of the electric source terminal is low, the phase shifter can not utilized as the conventional delay circuit.

2.1. Previously Proposed Art

A conventional delay circuit in which a low electric potential is applied to an electric source potential to delay an analog signal has been recently used.

FIG. 1 is a circuit diagram of a conventional delay circuit in which a low electric potential is applied to an electric source potential to delay an analog signal.

As shown in FIG. 1, a conventional delay circuit 11 is provided with a first resistor $R_{11}$ of which one end is connected to an electric source terminal 12, an npn type of transistor $Q_{11}$ of which a collector is connected to another end of the first resistor $R_{11}$ and a base is connected to an input terminal 13, a second resistor $R_{12}$ of which one end is connected to an emitter of the transistor $Q_{11}$ and another end is grounded, a capacitor $C_{11}$ of which one end is connected between the first resistor $R_{11}$ and the transistor $Q_{11}$ and another end is connected to an output terminal 14, and a third resistor $R_{13}$ of which one end is connected between the second resistor $R_{12}$ and the transistor $Q_{11}$ and another end is connected to the output terminal 14.

In the above configuration, a sinusoidal analog signal is transferred from the input terminal 13 to the base of the transistor $Q_{11}$ as an input signal. Thereafter, the analog signal is amplified in the transistor $Q_{11}$ and is delayed in the delay circuit 11 by coaction of the resistors $R_{11}$, $R_{12}$, $R_{13}$ and the capacitor $C_{11}$ before the analog signal delayed is output from the output terminal 14 as an output signal.

In this case, because the transistor $Q_{11}$ and the resistors $R_{11}$, $R_{12}$ are only arranged between the electric source terminal 12 and ground, the analog signal is reliably amplified and delayed in the delay circuit 11 even though the electric potential of the electric source terminal 12 is less than 3 V.

Also, in cases where the forward current gain $h_{fe}$ of the transistor $Q_{11}$ is large enough and in cases where stray capacitance which is, for example, generated between lines is small enough, the analog signal passes through the delay circuit 11. In addition, in cases where a resistance of the first resistor $R_{11}$ equals a resistance of the second resistor $R_{12}$ and in cases where a resistance R of the third resistor $R_{13}$ is larger enough than an emitter resistance $r_e$ of the transistor $Q_{11}$, the analog signal passes through the delay circuit 11 without decreasing an amplitude of the analog signal even though the frequency of the analog signal belongs in any band. In other words, analog signals ranging over all bands can pass through the delay circuit 11. Therefore, all-pass characteristics is exhibited in the delay circuit 11.

In this case, a transfer function $H_o(\omega)$ of the delay circuit 11 defined as a ratio of a Laplace transformed output function $Y_o(\omega)$ of the output signal to a Laplace transformed input function $X_o(\omega)$ of the input signal is formulated according to an equation (1).

$$H_o(\omega) = (1 - j\omega RC)/(1 + j\omega RC) \tag{1}$$

Wherein, the symbol j denotes an imaginary number, the symbol $\omega$ denotes an angular frequency of the analog signal, the symbol R denotes a resistance of the third resistor $R_{13}$, the symbol C denotes a capacitance of the capacitor $C_{11}$, and the symbol $r_e$ denotes the emitter resistance $r_e$ of the transistor $Q_{11}$.

A delay time function $Td_o(\omega)$ denoting delay time characteristics of analog signals ranging over all bands is determined by utilizing the equation (1).

$$Td_o(\omega) = 2RC/\{1 + (\omega RC)^2\} \tag{2}$$

Specifically, a low band delay time $Td_o$ in a low band $(1 >> \omega RC)$ is $$Td_o = 2RC \tag{3}$$

2-2 PROBLEMS TO BE SOLVED BY THE INVENTION

However, constants R, $r_e$, and C in the transfer function $H_o(\omega)$ depend on the constructional elements of the delay circuit 11 so that all of the constants R, $r_e$, and C are fixed. That is, the transfer function $H_o(\omega)$ only depends on the angular frequency $\omega$ of the analog signal.

Accordingly, it is difficult to change the transfer function $H_o(\omega)$, independent of the angular frequency $\omega$ of the analog signal. Therefore, a delay time such as the low band delay time $Td_o$ can not be adjusted as required, independent of the angular frequency $\omega$ of the analog signal.

SUMMARY OF THE INVENTION

An object of the present invention is to provide, with due consideration to the drawbacks of such a conventional delay circuit, a delay circuit in which a delay time of an analog signal is changeable on condition that a dynamic range for the analog signal is enough to delay the analog signal even though an electric potential of an electric source terminal is low.

The object is achieved by the provision of a delay circuit, comprising:

- a transistor of which a base is connected to an input terminal;
- a changeable current source through which an electric current changeably flows between an emitter of the transistor and a first reference potential point, an emitter resistance of the transistor being changed in dependence on the electric current;
- a first resistor of which one end is connected to the emitter of the transistor and another end is connected to an output terminal;
- a second resistor of which one end is connected to a collector of the transistor and another end is connected to a second reference potential point;
- a first capacitor of which one end is connected to the emitter of the transistor and another end is connected to a third reference potential point; and
- a second capacitor of which one end is connected to the collector of the transistor and another end is connected to the output terminal.

In the above configuration, when an analog signal is applied to the base of the transistor through the input terminal, the amplitude of the analog signal is amplified in the transistor. Also, the analog signal is delayed by coaction of the first and second resistors, the first and second capacitors, and the emitter resistance of the transistor. Thereafter, the analog signal delayed is transferred to the output terminal.

In this case, because an electric current flowing between the emitter of the transistor and the first reference potential point is changeable, the emitter resistance of the transistor can be changed. In cases where the emitter resistance is changed, the delay time of the analog signal varies.

Accordingly, the delay time of the analog signal can be easily changed in the delay circuit.

Also, because the second resistor, the transistor and the changeable current source are only arranged between the first and second reference potential points, the transistor can be operated even though an electric potential difference between the first and second reference potential points is low.

It is preferred that a relationship between a resistance ratio a ($a = R2/R1$) of a second resistance R2 of the second resistor to a first resistance R1 of the first resistor and a capacitance ratio b ($b = C1/C2$) of a first capacitance C1 of the first capacitor to a second capacity C2 of the second capacitor be formulated by an equation $a*b = 1$ or $a*b = (1+2a)^2$.

In the above configuration, frequency characteristics of the amplitude of the analog signal becomes almost flat in a range over all bands.

Accordingly, even though the frequency of the analog signal is changed, the amplitude of the analog signal can be maintained at almost a regular value in the delay circuit.

In addition to the above relationship, it is preferred that another relationship among the emitter resistance $r_e$ of the transistor, the first resistance R1 of the first resistor, and the second resistance R2 of the second resistor be formulated by an equation $r_e = R1*R2/(R1+R2)$ on condition that the electric current changeably flowing through the changeable current source equals a current value.

In the above configuration, the frequency characteristics of the amplitude of the analog signal becomes flat in a range over all bands.

Accordingly, even though the frequency of the analog signal is changed, the amplitude of the analog signal can be maintained at a regular value in the delay circuit.

Also, the object is achieved by the provision of a delay circuit, comprising:

- a first transistor of which a base is connected to an input terminal;
- a first changeable current source through which a first electric current changeably flows between an emitter of the first transistor and a first reference potential point, a first emitter resistance of the first transistor being changed in dependence on the first electric current;
- a first resistor of which one end is connected to the emitter of the first transistor;
- a second resistor of which one end is connected to a collector of the first transistor and another end is connected to a second reference potential point;
- a first capacitor of which one end is connected to the emitter of the first transistor and another end is connected to a third reference potential point;
- a second capacitor of which one end is connected to the collector of the first transistor;
- a second transistor of which a base is connected to both another end of the first resistor and another end of the second capacitor;
- a second changeable current source through which a second electric current changeably flows between an emitter of the second transistor and a fourth reference potential point, a second emitter resistance of the second transistor being changed in dependence on the second electric current;
- a third resistor of which one end is connected to the emitter of the second transistor and another end is connected to an output terminal;
- a fourth resistor of which one end is connected to a collector of the second transistor and another end is connected to a fifth reference potential point;
- a third capacitor of which one end is connected to the emitter of the second transistor and another end is connected to a six reference potential point; and
- a fourth capacitor of which one end is connected to the collector of the second transistor and another end is connected to the output terminal.

In the above configuration, when an analog signal is applied to the base of the first transistor through the input terminal, the amplitude of the analog signal is amplified in the first transistor. Also, the analog signal is delayed by coaction of the first and second resistors, the first and second capacitors, and the first emitter resistance of the first resistor. Thereafter, the analog signal delayed is transferred to the base of the second transistor.

Thereafter, the analog signal is again delayed by coaction of the third and fourth resistors, the third and fourth capacitors, and the second emitter resistance of the second transistor. Thereafter, the analog signal delayed is transferred to the output terminal.

In this case, because a first electric current flowing through the first changeable electric source is changeable, the first emitter resistance of the first transistor can be changed. In cases where the first emitter resistance is changed, the delay time of the analog signal varies.

Also, because a second electric current flowing through the second changeable electric source is changeable, the second emitter resistance of the second transistor can be changed. In cases where the second emitter resistance of the second transistor is changed, the delay time of the analog signal varies.

Accordingly, the delay time of the analog signal can be easily changed in the delay circuit.

Also, because the second resistor, the first transistor and the first changeable current source are only arranged between the first and second reference potential points, the first transistor can be operated even though an electric potential difference between the first and second reference potential points is low.

Also, because the fourth resistor, the second transistor and the second changeable current source are only arranged between the fourth and fifth reference potential points, the second transistor can be operated even though an electric potential difference between the fourth and fifth reference potential points is low.

Also, the object is achieved by the provision of a delay circuit, comprising:
- a first transistor of which a base is connected to an input terminal and a collector is connected to a first reference potential point;
- a first changeable current source through which a first electric current changeably flows between an emitter of the first transistor and a second reference potential point, a first emitter resistance of the first transistor being changed in dependence on the first electric current;
- a first capacitor of which one end is connected to the emitter of the first transistor and another end is connected to a third reference potential point;
- a second transistor of which a base is connected to the emitter of the first transistor, a collector is connected to a fourth reference potential point, and an emitter is connected to an output terminal;
- a second changeable current source through which a second electric current changeably flows between an emitter of the second transistor and a fifth reference potential point, a second emitter resistance of the second transistor being changed in dependence on the second electric current; and
- a second capacitor of which one end is connected to the emitter of the second transistor and another end is connected to a six reference potential point.

In the above configuration, when an analog signal is applied to the base of the first transistor through the input terminal, the amplitude of the analog signal is amplified in the first transistor. Also, the analog signal is delayed by coaction of the first capacitor and the first emitter resistance of the first transistor. Thereafter, the analog signal delayed is transferred to the base of the second transistor.

Thereafter, the analog signal is again delayed by coaction of the second capacitor and the second emitter resistance of the second transistor. Thereafter, the analog signal delayed is transferred to the output terminal.

In this case, because a first electric current flowing through the first changeable electric source is changeable, the first emitter resistance of the first transistor can be changed. In cases where the first emitter resistance is changed, the delay time of the analog signal varies.

Also, because a second electric current flowing through the second changeable electric source is changeable, the second emitter resistance of the second transistor can be changed. In cases where the second emitter resistance of the second transistor is changed, the delay time of the analog signal varies.

Accordingly, the delay time of the analog signal call be easily changed in the delay circuit.

Also, because the first transistor and the first changeable current source are only arranged between the first and second reference potential points, the first transistor can be operated even though an electric potential difference between the first and second reference potential points is low.

Also, because the second transistor and the second changeable current source are only arranged between the fourth and fifth reference potential points, the second transistor can be operated even though an electric potential difference between the fourth and fifth reference potential points is low.

Also, the object is achieved by the provision of a multi-stage delay circuit comprising a plurality of delay circuit units $DC_m$ (m=1, 2, - - -, i, - - -, n) arranged in series, each of the delay circuit units $DC_i$ comprising:
- a first transistor of which a base is connected to an input terminal, the input terminal being connected to the delay circuit unit $DC_{i-1}$ in an upper stage, and an analog signal being applied to the input terminal of the delay circuit unit $DC_1$ in a first stage;
- a first changeable current source through which a first electric current changeably flows between an emitter of the first transistor and a first reference potential point, a first emitter resistance of the first transistor being changed in dependence on the first electric current;
- a first resistor of which one end is connected to the emitter of the first transistor;
- a second resistor of which one end is connected to a collector of the first transistor and another end is connected to a second reference potential point;
- a first capacitor of which one end is connected to the emitter of the first transistor and another end is connected to either the first reference potential point or the second reference potential point;
- a second capacitor of which one end is connected to the collector of the first transistor;
- a second transistor of which a base is connected to both another end of the first resistor and another end of the second capacitor;
- a second changeable current source through which a second electric current changeably flows between an emitter of the second transistor and the second reference potential point, a second emitter resistance of the second transistor being changed in dependence on the second electric current;
- a third resistor of which one end is connected to the emitter of the second transistor and another end is connected to an output terminal, the output terminal being connected to the input terminal of the delay circuit unit $DC_{i+1}$ in a lower stage, and the analog signal being output from the output terminal of the delay circuit $DC_n$ in a final stage;
- a fourth resistor of which one end is connected to a collector of the second transistor and another end is connected to the first reference potential point;
- a third capacitor of which one end is connected to the emitter of the second transistor and another end is connected to either the first reference potential point or the second reference potential point; and a fourth capacitor of which one end is connected to the collector of the second transistor and another end is connected to the output terminal.

In the above configuration, an analog signal applied to the input terminal of the delay circuit unit $DC_1$ arranged in the first stage is delayed in each of the delay circuit units DCm without increasing nor decreasing the amplitude of the analog signal. A total delay time of the analog signal in the multi-stage delay circuit is determined by summing pieces of delay time in the delay circuit units.

Accordingly, the total delay time obtained in the multi-stage delay circuit can be large even though only two transistors are arranged as active elements in each of the delay circuit units.

Also, the object is achieved by the provision of a multi-stage delay circuit comprising a plurality of delay circuit units $DC_m$ (m=1, 2, - - -, i, - - -, n) arranged in series, each of the delay circuit units $DC_i$ comprising:

a first transistor of which a base is connected to an input terminal and a collector is connected to a first reference potential point, the input terminal being connected the delay circuit unit $DC_{i-1}$ in an upper stage, and an analog signal being applied to the input terminal of the delay circuit unit $DC_1$ in a first stage;

a first changeable current source through which a first electric current changeably flows between an emitter of the first transistor and a second reference potential point, a first emitter resistance of the first transistor being changed in dependence on the first electric current;

a first capacitor of which one end is connected to the emitter of the first transistor and another end is connected to either the first reference potential point or the second reference potential point;

a second transistor of which a base is connected to the emitter of the first transistor, a collector is connected to the second reference potential point, and an emitter is connected to an output terminal, the output terminal being connected to the input terminal of the delay circuit unit $DC_{i+1}$ in a lower stage, and the analog signal being output from the output terminal of the delay circuit unit$DC_n$ in a final stage;

a second changeable current source through which a second electric current changeably flows between an emitter of the second transistor and the first reference potential point, a second emitter resistance of the second transistor being changed in dependence on the second electric current; and a second capacitor of which one end is connected to the emitter of the second transistor and another end is connected to either the first reference potential point or the second reference potential point.

In the above configuration, an analog signal applied to the input terminal of the delay circuit unit $DC_1$ arranged in the first stage is delayed in each of the delay circuit units DCm without increasing nor decreasing the amplitude of the analog signal. A total delay time of the analog signal in the multi-stage delay circuit is determined by summing pieces of delay time in the delay circuit units.

In this case, because the multi-stage delay circuit is manufactured by passive elements, emitter follower circuits, and the electric current sources, noise generated in one of the delay circuit units is not amplified without decreasing the amplitude of the analog signal.

Accordingly, the total delay time obtained in the multi-stage delay circuit can be large even though only two transistors are arranged as active elements in each of the delay circuit units.

BRIEF DESCRIPTION OF THE DRAWINGS

The objects, features and advantages of the present invention will be apparent from the following description taken in conjunction with the accompanying drawings, in which.

DETAIL DESCRIPTION OF THE PREFERRED EMBODIMENTS

Preferred embodiments of a delay circuit according to the present invention are described with reference to drawings.

1. First embodiment

A first embodiment is described with reference to FIGS. 2, 3.

Figure 1:
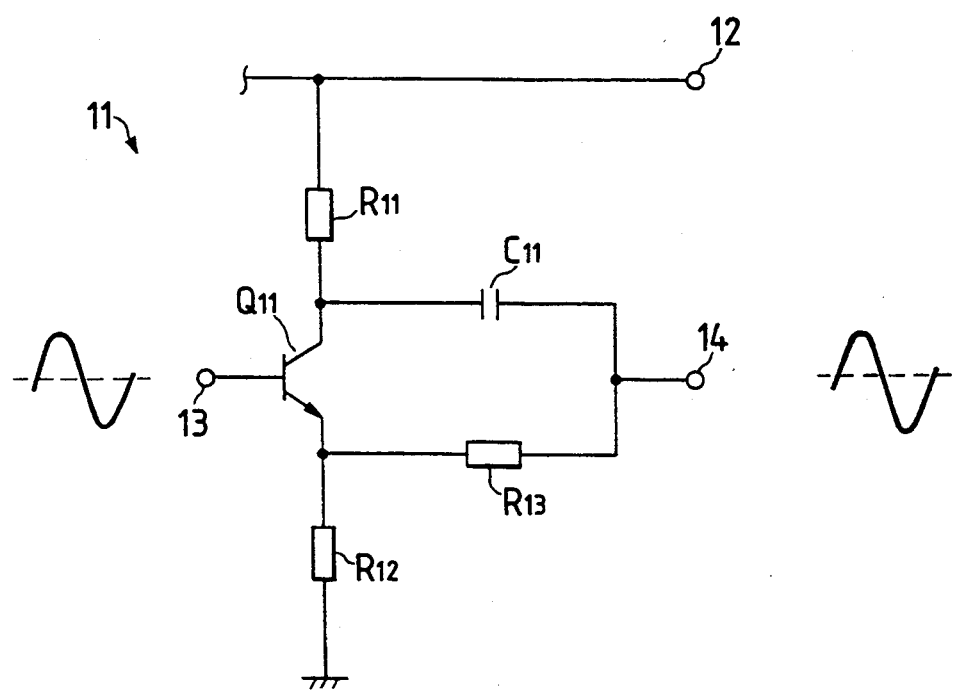
FIG. 1 is a circuit diagram of a conventional delay circuit in which a low electric potential is applied to an electric source potential to delay an analog signal.
Figure 2:
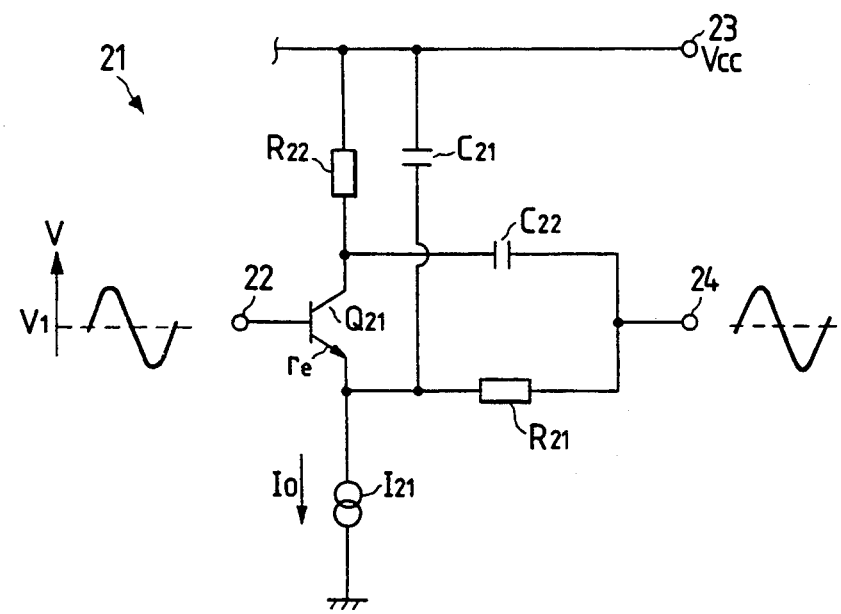
FIG. 2 is a circuit diagram of a delay circuit unit according to a first embodiment, a low electric potential being applied to an electric source terminal.

FIG. 2 is a circuit diagram of a delay circuit unit according to a first embodiment, a low electric potential being applied to an electric source terminal.

As shown in FIG. 2, a delay circuit unit 21 according to the first embodiment comprises an npn type of first transistor $Q_{21}$ of which a base is connected to an input terminal 22, a first changeable current source $I_{21}$ through which an electric current $I_o$ flows from an emitter of the transistor $Q_{21}$ to ground, a first capacitor $C_{21}$ of which one end is connected to the emitter of the transistor $Q_{21}$ and another end is connected to an electric source terminal 23, a second capacitor $C_{22}$ of which one end is connected to a collector of the transistor $Q_{21}$ and another end is connected to an output terminal 24, a first resistor $R_{21}$ of which one end is connected to the emitter of the transistor $Q_{21}$ and another end is connected to the output terminal 24, a second resistor $R_{22}$ of which one end is connected to the collector of the transistor $Q_{21}$ and another end is connected to the electric source terminal 23.

The electric current $I_o$ of the changeable current source $I_{21}$ is changeable under control of a control section (not shown).

Also, a direct current voltage Vcc is always applied to the electric source terminal 23, and a direct current bias voltage V1 is always applied to the base of the transistor $Q_{21}$ to turn on the transistor $Q_{21}$.

In cases where the electric current $I_o$ flows through the emitter of the transistor $Q_{21}$, an emitter resistance $r_e$ exists in the emitter of the transistor $Q_{22}$. The emitter resistance $r_e$ is formulated by an equation (4).

$$r_e = kT/qI_o \quad (4)$$

Wherein, the symbol k denotes the Boltzmann constant, the symbol T denotes an absolute temperature of the transistor $Q_{21}$, and the symbol q denotes the electric charge of an electron. Accordingly, the emitter resistance $r_e$ is changeable depending on the electric current $I_o$ of the changeable current source $I_{21}$.

In the above configuration, when a sinusoidal analog signal is transferred from the input terminal 22 to the base of the transistor $Q_{21}$ as an input signal, the analog signal is amplified in the transistor $Q_{21}$ and is delayed by the function of the first resistor $R_{21}$, the second resistor $R_{22}$, the first capacitor $C_{21}$, and the second capacitor $C_{22}$ in the delay circuit unit 21 before the analog signal delayed is output from the output terminal 24 as an output signal.

In this case, the forward current gain $h_{fe}$ of the transistor $Q_{21}$ is large enough, and stray capacitance of the delay circuit unit 21 is small enough in the delay circuit unit 21. Therefore, a transfer function $H_1(\omega)$ of the delay circuit unit 21 defined as a ratio of a Laplace transformed output function $Y_1(\omega)$ of the output signal to a Laplace transformed input function $X_1(\omega)$ of the input signal is formulated by an equation (5).

$$H_1(\omega) = (1+\omega^2 R_1 R_2 C_1 C_2) / \{1+j\omega(R_1 C_2 + r_e C_1 + r_e C_2) - \omega^2 r_e(R_1+R_2)C_1 C_2\} \quad (5)$$

Wherein, the symbol j denotes an imaginary number, the symbol $\omega$ denotes an angular frequency of the analog signal, the symbol $R_1$ denotes a resistance of the first resistor $R_{21}$, the symbol $R_2$ denotes a resistance of the second resistor $R_{22}$, the symbol $C_1$ denotes a capacitance of the first capacitor $C_{21}$, the symbol $C_2$ denotes a capacitance of the second capacitor $C_{22}$, and the symbol $r_e$ denotes the emitter resistance of the transistor $Q_{21}$.

Because the numerator $(1+\omega^2 R_1 R_2 C_1 C_2)$ of the equation (5) is rearranged to $\{1-j\omega(R_1 R_2 C_1 C_2)^{\frac{1}{2}}\}*\{1+j\omega(R_1 R_2 C_1 C_2)^{\frac{1}{2}}\}$, the all-pass characteristics in which analog signals ranging over all bands can pass through the delay circuit unit 21 without decreasing the amplitude thereof is exhibited on condition that the denominator $\{1+j\omega(R_1 C_2 + r_e C_1 + r_e C_2) - 2\omega^2 r_e R_1 C_1 C_2\}$ is expressed by $\{1+j\omega(R_1 R_2 C_1 C_2)^{\frac{1}{2}}\}^2$. That is, conditions that the all-pass characteristics are exhibited are expressed by equations (6), (7).

$$r_e = R_1 * R_2 / (R_1 + R_2) \quad (6)$$

$$R_1 C_2 + r_e C_1 + r_e C_2 = 2*(R_1 R_2 C_1 C_2)^{\frac{1}{2}} \quad (7)$$

To simplify the equations (7), equations (8), (9) is introduced.

$$R_2 = a*R_1 \quad (8)$$

$$C_1 = b*C_2 \quad (9)$$

In cases where the equation (7) is rearranged by substituting the equations (6), (8), and (9) into the equation (7), the ratio b is expressed by an equation (10).

$$a*b = 1 \text{ or } a*b = (1+2a)^2 \quad (10)$$

Accordingly, in cases where the equations (6), (10) are satisfied, the transfer function $H_1(\omega)$ formulated by the equation (5) indicates the all-pass characteristics.

In case of $a*b = 1$, the equation (5) is changed to an equation (11).

$$H_1(\omega) = (1-j\omega R_1 C_1)/\{1+j\omega r_e(R_1+R_2)C_2/R_2\} \quad (11)$$

For example, in cases where $a=1$ and $b=1$ are specially satisfied, the resistance $R_2$ of the second resistor $R_{22}$ equals the resistance $R_1$ of the first resistor $R_{21}$, and the capacitance $C_1$ of the first capacitor $C_{21}$ equals the capacitance $C_2$ of the second capacitor $C_{22}$. In this case, the equation (5) can be simplified. When a common resistance R ($R=R_1=R_2$) and a common capacitance C ($C=C_1=C_2$) are introduced, the equation (11) is changed to an equation (12).

$$H_1(\omega) = (1-j\omega RC)/(1+2j\omega r_e C) \quad (12)$$

Therefore, an amplitude characteristic function $G_1(\omega)$ indicating frequency characteristics of the amplitude of the analog signal in the delay circuit unit 21 is formulated by an equation (13).

$$G_1(\omega) = |H_1(\omega)| \qquad (13)$$

$$= [\{1 + (\omega RC)^2\}/\{1 + (2\omega r_e C)^2\}]^{\frac{1}{2}}$$

Also, a delay time function $Td_1(\omega)$ denoting frequency characteristics of the delay time of the analog signal in the delay circuit unit 21 is determined by utilizing the equation (12).

$$Td_1(\omega) = RC/\{1+(\omega RC)^2\} + 2r_e C/\{1+(2\omega r_e C)^2\} \qquad (14)$$

The equation (14) is available for analog signals ranging over all bands. Specifically, a low band delay time $Td_1$ in a low band $(1 \gg \omega RC)$ is expressed by an equation (15).

$$Td_1 = (R+2r_e)C \qquad (15)$$

Next, the frequency characteristics of the amplitude of the analog signal and frequency characteristics of the delay time of the analog signal are described in detail with reference to FIGS. 3A, 3B.

Figure 3A:
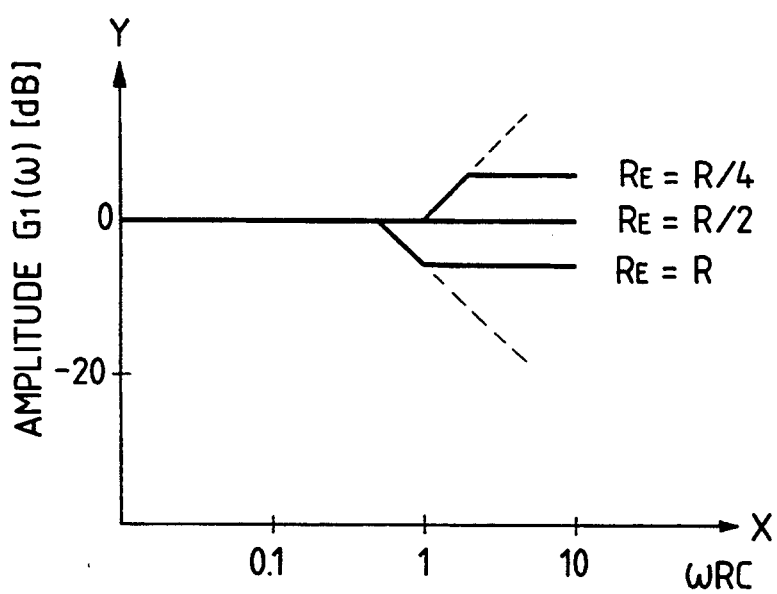
FIG. 3A graphically shows frequency characteristics of the amplitude of an analog signal in the delay circuit unit shown in FIG. 2, a relationship between an amplitude characteristic function $G(\omega)$ and an angular frequency $\omega$ of the analog signal being conceptually shown in logarihmic expression for an X-axis and a Y-axis.

FIG. 3A graphically shows the frequency characteristics of the amplitude of the analog signal in the delay circuit unit 21, a relationship between the amplitude characteristic function $G_1(\omega)$ and the angular frequency $\omega$ of the analog signal being conceptually shown in logarihmic expression for an X-axis and a Y-axis. FIG. 3B graphically shows the frequency characteristics of the delay time of the analog signal in the delay circuit unit 21, a relationship between the delay time function $Td_1(\omega)$ and the angular frequency $\omega$ of the analog signal being shown in logarihmic expression for an X-axis.

Figure 3B:
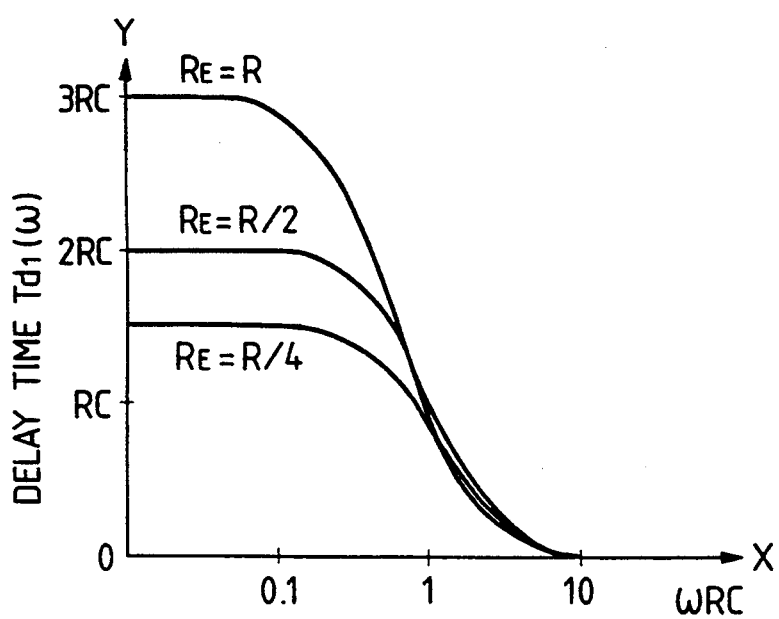
FIG. 3B graphically shows frequency characteristics of a delay time of an analog signal in the delay circuit unit shown in FIG. 2, a relationship between a delay time function $Td_1(\omega)$ and an angular frequency $\omega$ of the analog signal being shown in logarihmic expression for an X-axis.

The angular frequency $\omega$ of the analog signal expressed in the X-axis is normalized and expressed by a variable $\omega RC$ in FIGS. 3A, 3B.

Also, three types of amplitude characteristic functions $G_1(\omega)$ obtained by changing the electric current $I_o$ of the changeable current source $I_{22}$ are shown in FIG. 3A. One type corresponds to a condition $r_e = R/2$ on which the all-pass characteristics are exhibited. That is, in cases where the condition $r_e = R/2$ is satisfied, analog signals ranging over all bands can be delayed without decreasing the amplitude of the analog signals. Other types correspond to conditions $r_e = R/4$ and $r_e = R$. Also, three types of delay time functions $Td_1(\omega)$ obtained by changing the electric current $I_o$ of the changeable current source $I_{21}$ are shown in FIG. 3B. One type corresponds to a condition $r_e = R/2$ on which the all band pass characteristics are exhibited. Other types correspond to conditions $r_e = R/4$ and $r_e = R$.

As shown in FIG. 3A, the amplitude of the analog signal is not changed in angular frequencies ranging over all bands in case of $r_e = R/2$. In contrast, the amplitude of the analog signal is increased at a high band in case of $r_e < R/2$, and the amplitude of the analog signal is decreased at the high band in case of $r_e > R/2$.

Also, as shown in FIG. 3B, the delay time of the analog signal in the delay circuit unit 21 equals 2RC at a low band in case of $r_e = R/2$. In contrast, the delay time of the analog signal is decreased from 2RC at the low band in case of $r_e < R/2$, and the delay time is increased from 2RC at the low band in case of $r_e > R/2$.

Also, frequency characteristics of the delay time function $Td_1(\omega)$ are shown in FIG. 3B. That is, the delay time is not changed up to the angular frequency $\omega = 0.1/(RC)$ in case of $r_e \leq R/2$. In addition, in proportion as the emitter resistance re is decreased (or the delay time is decreased), a range of angular frequencies in which the delay time is not changed is widen.

Next, the frequency characteristics of the amplitude shown in FIG. 3A and the frequency characteristics of the delay time shown in FIG. 3B are compared with each other. In this case, because a range of angular frequencies in which the amplitude of the analog signal is not changed is wide enough as compared with another range of angular frequencies in which the delay time of the analog signal is not changed, the amplitude of the analog signal transferred through the delay circuit unit 21 is not substantially decreased when the analog signal is substantially delayed in the delay circuit unit 21.

Also, on condition that the equations (6), (10) are substantially satisfied in the delay circuit unit 21, the frequency characteristics of the amplitude shown in FIG. 3A and the frequency characteristics of the delay time shown in FIG. 3B can be substantially applied to frequency characteristics of the delay circuit unit 21 which is generally characterized by the transfer function $H_1(\omega)$ formulated by the equation (5).

Accordingly, because the first and second resistors $R_{21}$, $R_{22}$ and the transistor $Q_{21}$ are only arranged between the electric source terminal 23 and the ground, the analog signal can be reliably delayed in the delay circuit unit 21 even though the electric potential applied to the electric source terminal 23 is low.

Also, because the emitter resistance $r_e$ of the transistor $Q_{21}$ is inversely proportional to the electric current $I_o$ of the changeable current source $I_{21}$, the emitter resistance $r_e$ can be changed in cases where the electric current $I_o$ is changed. Therefore, the transfer function $H_1(\omega)$ formulated by the equation (5) is changed so that the delay time function $Td_1(\omega)$ and the low band delay time $Td_1$ are changed. That is, the delay time is changeable in the delay circuit unit 21.

Also, in cases where the electric current $I_o$ is adjusted so as to satisfy the relation $r_e = R/2$, the amplitude of the analog signal is not changed in an angular frequency range from a low band to a high band.

Next, temperature characteristics of the low band delay time $Td_1$ are described.

In cases where the emitter resistance $r_e$ of the transistor $Q_{21}$ formulated by the equation (4) is substituted into the equation (15), the low band delay time $Td_1$ is expressed by an equation (16).

$$Td_1 = RC*\{1+(2k/q)*(T/RI_o)\} \qquad (16)$$

The resistance of the resistors $R_{21}$, $R_{22}$ and the capacitance of the capacitors $C_{21}$, $C_{22}$ hardly depend on temperatures of the resistors and the capacitors because of the advancement of recent semiconductor manufacturing processes. Therefore, the term RC in the equation (16) does not substantially depend on the temperatures of the resistors and the capacitors. Also, the absolute temperature T °K. of the transistor $Q_{21}$ is changed with a temperature slope of about 0.003356 $(1/T = 1/(273+25))$ at a room temperature of 25° C. Therefore, in cases where the term $RI_o$ has the same temperature dependence as that of the absolute temperature T, the term $T/RI_o$ does not depend on the temperatures of the resistors $R_{21}$, $R_{22}$ and the transistor $Q_{21}$. The electric current $I_o$ of the constant current source $I_{21}$ can be easily adjusted by utilizing an electric potential difference $V_{BE}$ between the base and the emitter of the transistor $Q_{21}$ which depends on the absolute temperature T of the transistor $Q_{21}$. In addition, even though the term RC slightly depends on the temperatures of the resistors and the capacitors, a slight change of the temperature dependence of the electric current $I_o$ can compensate for the temperature dependence of the term RC.

Accordingly, the analog signals can be changeably delayed in the delay circuit unit 21, independent of the temperatures of constructional elements.

Figure 8:
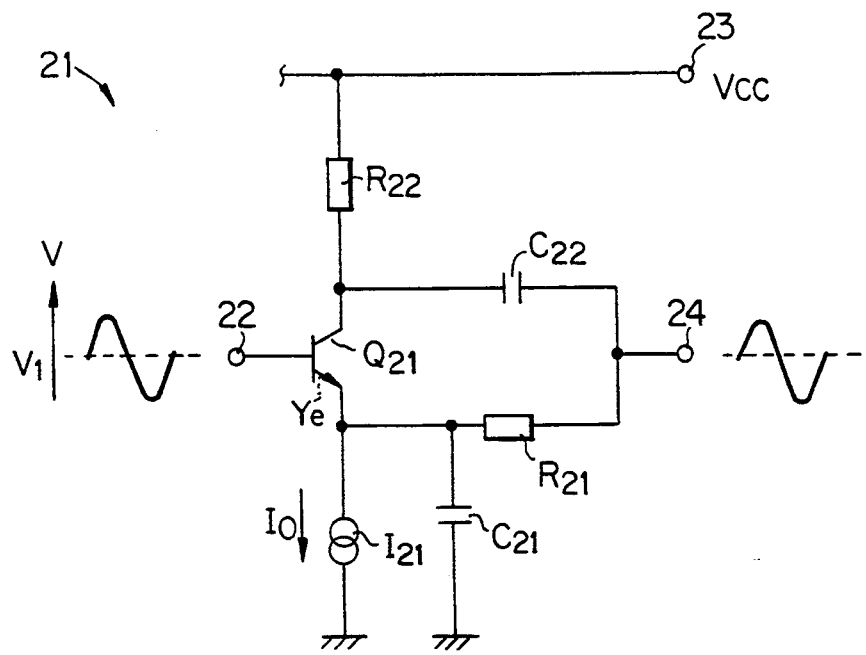
FIG. 8 is a circuit diagram of a delay circuit unit according to a fourth embodiment, a low electric potential being applied to an electric source terminal.
Figure 9A:
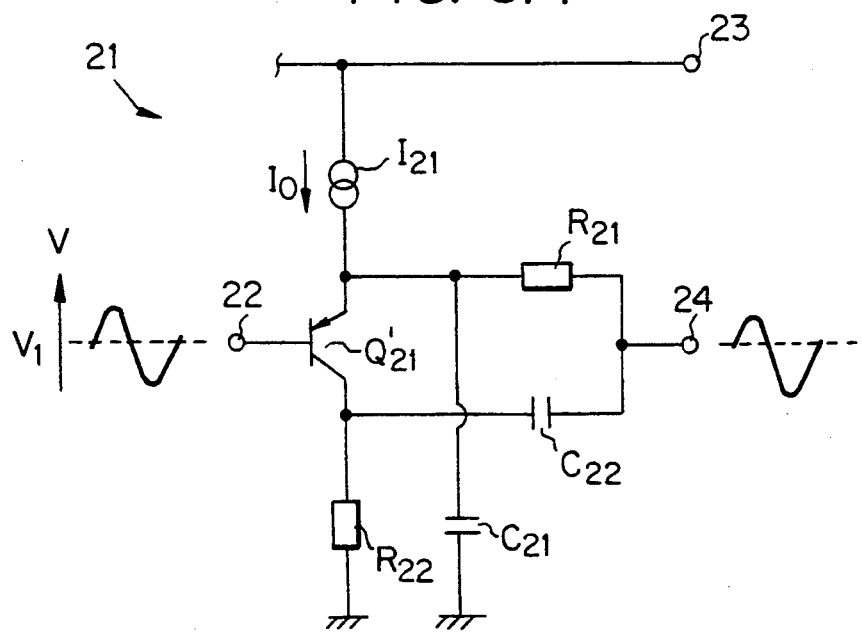
FIG. 9A and 9B are circuit diagrams according to a fifth and a sixth embodiment where PNP type transistors are used.
Figure 9B:
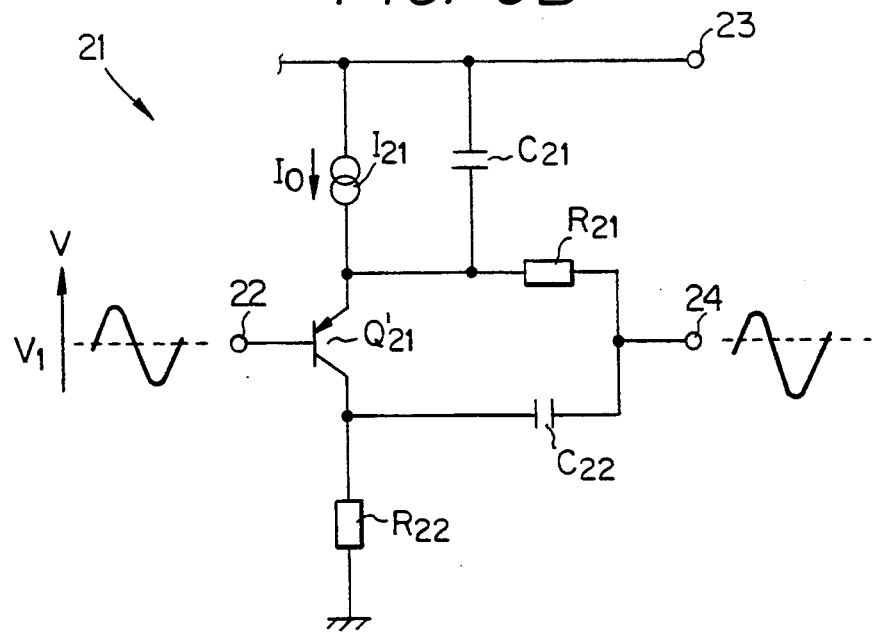

In the first embodiment, the other end of the first capacitor $C_{21}$ is connected to the electric source terminal 23. However as shown in FIG. 8, it may also be preferred that the other end of the first capacitor $C_{21}$ be grounded in the delay circuit unit 21. Also, the transistor $Q_{21}$ is of the npn type. However, as shown in FIGS. 9A and 9B, it is preferred that a pnp type of transistor $Q_{21}$ be utilized in the delay circuit unit 21 in place of the npn type of transistor $Q_{21}$.

2. Second Embodiment:

Next, a second embodiment is described with reference to FIG. 4.

Figure 4:
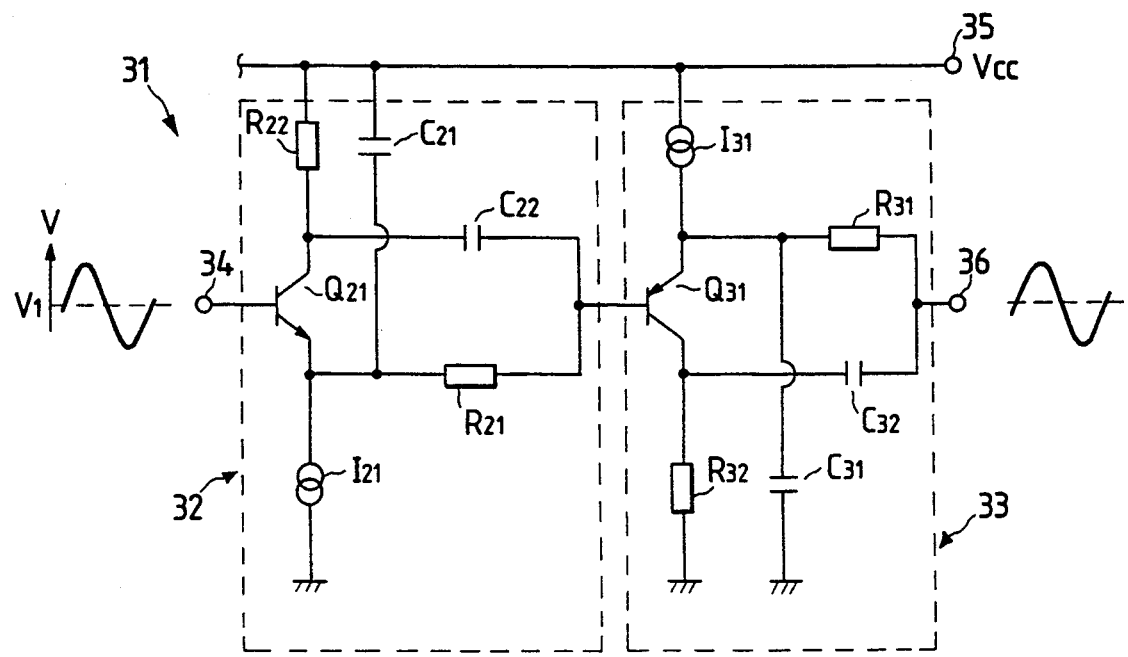
FIG. 4 is a circuit diagram of a delay circuit unit according to a second embodiment, a low electric potential being applied to an electric source terminal.

FIG. 4 is a circuit diagram of a delay circuit unit according to a second embodiment, a low electric potential being applied to an electric source terminal.

As shown in FIG. 4, a delay circuit unit 31 according to the second embodiment comprises a first delay section 32 and a second delay section 33. The first and second delay sections 32, 33 are arranged in series. Therefore, a sinusoidal analog signal is initially delayed in the first delay section 32. Thereafter, the analog signal is again delayed in the second delay section 33.

Constructional elements of the first delay section 32 are the same as those of the delay circuit unit 21 according to the first embodiment. That is, the first delay section 32 comprises the npn type of first transistor $Q_{21}$ of which a base is connected to an input terminal 34, the second resistor $R_{22}$ connected to the emitter of the transistor $Q_{21}$ and an electric source terminal 35, the first changeable current source $I_{21}$, the first capacitor $C_{21}$, the second capacitor $C_{22}$, the first resistor $R_{21}$.

The second delay section 33 comprises a pnp type of second transistor $Q_{31}$ of which a base is connected between the second capacitor $C_{22}$ and the first resistor $R_{21}$ of the first delay section 32, a second changeable current source $I_{31}$ through which an electric current $I_1$ flows from the changeable source terminal 35 to an emitter of the transistor $Q_{31}$, a third resistor $R_{31}$ of which one end is connected to the emitter of the transistor $Q_{31}$ and another end is connected to an output terminal 36, a fourth resistor $R_{32}$ of which one end is connected to a collector of the transistor $Q_{31}$ and another end is grounded, a third capacitor $C_{31}$ of which one end is connected to the emitter of the transistor $Q_{31}$ and another end is grounded, and a fourth capacitor $C_{32}$ of which one end is connected to the collector of the transistor $Q_{31}$ and another end is connected to the output terminal 36.

A direct current voltage Vcc is always applied to the electric source terminal 35, and a direct current bias voltage V1 is always applied to the base of the transistor $Q_{21}$ to turn on the transistor $Q_{21}$. Also, in cases where the direct current bias voltage V1 is applied to the base of the transistor $Q_{31}$, the transistor $Q_{31}$ is turned on.

The electric current $I_o$ of the first changeable current source $I_{21}$ and the electric current $I_1$ of the second changeable current source $I_{31}$ are respectively changeable under control of a control section (not shown), as formulated by the equation (4). In cases where the electric current $I_1$ equals the electric current $I_o$, an emitter resistance of the transistor $Q_{31}$ equals a value $r_e = kT/qI_o$.

In the above configuration, when the sinusoidal analog signal is transferred from the input terminal 34 to the base of the transistor $Q_{21}$ as an input signal, the analog signal is amplified in the transistor $Q_{21}$ and is delayed by the function of the first resistor $R_{21}$, the second resistor $R_{22}$, the first capacitor $C_{21}$, and the second capacitor $C_{22}$ in the first delay section 32 of the delay circuit unit 31 before the analog signal delayed is applied to the base of the transistor $Q_{31}$. Thereafter, the analog signal is again delayed by the function of the third resistor $R_{31}$, the fourth resistor $R_{32}$, the third capacitor $C_{31}$, and the forth capacitor $C_{32}$ in the second delay section 33 of the delay circuit unit 31 before the analog signal delayed is output from the output terminal 36 as an output signal.

In this case, the forward current gains $h_{fe}$ of the transistors $Q_{21}$, $Q_{31}$ are large enough, and stray capacitance of the delay circuit unit 31 is small enough. Therefore, the analog signal passes through the delay circuit unit 31 without decreasing the amplitude of the analog signal.

Also, the electric current $I_1$ equals the electric current $I_o$ so that the emitter resistance of the transistor $Q_{31}$ is $r_e$.

Also, the resistance R1 of the first resistor $R_{21}$, the resistance R2 of the second resistor $R_{22}$, a resistance R3 of the third resistor $R_{31}$, and a resistance R4 of the fourth resistor $R_{32}$ respectively equals a common resistance R (R=R1=R2=R3=R4). Also, the capacitance C1 of the first capacitor $C_{21}$, the capacitance C2 of the second capacitor $C_{22}$, a capacitance C3 of the third capacitor $C_{31}$, and a capacitance C4 of the fourth capacitor $C_{32}$ respectively equals a common capacitance C (C=C1=C2=C3=C4).

Therefore, a transfer function $H_2(\omega)$ of the delay circuit unit 31 defined as a ratio of a Laplace transformed output function $Y_2(\omega)$ of the output signal to a Laplace transformed input function $X_2(\omega)$ of the input signal is formulated by an equation (17).

$$H_2(\omega) = \{(1 - j\omega RC)/(1 + 2j\omega r_e C)\}^2 \qquad (17)$$

Wherein, the symbol j denotes an imaginary number, and the symbol $\omega$ denotes an angular frequency of the analog signal.

Also, an amplitude characteristic function $G_2(\omega)$ indicating frequency characteristics of the amplitude of the analog signal in the delay circuit unit 31 is formulated by an equation (18).

$$\begin{aligned} G_2(\omega) &= |H_2(\omega)| \\ &= \{1 + (\omega RC)^2\}/\{1 + (2\omega r_e C)^2\} \end{aligned} \qquad (18)$$

Because the amplitude characteristic function $G_2(\omega)$ equals the amplitude characteristic function $G_1(\omega)$ squared, a value of the function $G_2(\omega)$ is almost 0 dB in an angular frequency range up to a middle band in the same manner as a value of the function $G_1(\omega)$ shown in FIG. 3A. Therefore, a direct current voltage applied to the base of the transistor $Q_{31}$ equals the direct current bias voltage V1 applied to the input terminal 34. Also, a direct current voltage applied to the output terminal equals the direct current bias voltage V1 applied to the input terminal 34. Accordingly, even though the direct current voltage Vcc applied to the electric source terminal 35 is low, the dynamic range in the delay circuit unit 31 is large enough.

Also, a delay time function $Td_2(\omega)$ denoting frequency characteristics of the delay time of the analog signal in the delay circuit unit 31 is determined by utilizing the equation (17).

$$Td_2(\omega) = 2*[RC/\{1+(\omega RC)^2\} + 2r_e C/\{1+(2\omega r_e C)^2\}] \quad (19)$$

Specifically, a low band delay time $Td_2$ in a low band $(1 >> \omega RC)$ is expressed by an equation (20).

$$Td_2 = 2*(R + 2r_e)C \quad (20)$$

Accordingly, because the emitter resistance $r_e$ of the transistors $Q_{21}$, $Q_{31}$ can be changed by changing the electric currents $I_o$, $I_1$ of the changeable current sources $I_{21}$, $I_{31}$, the delay time function $Td_2(\omega)$ and the low band delay time $Td_2$ can be changed. Therefore, the analog signal can be changeably delayed in the delay circuit unit 31.

Also, the all-pass characteristics can be exhibited in cases where the emitter resistance $r_e = R/2$ is satisfied.

Also, because the delay time function $Td_2(\omega)$ is twice the delay time function $Td_1(\omega)$ according to the first embodiment, the analog signal in the delay circuit unit 31 can be delayed twice as much as in the delay circuit unit 21.

In the second embodiment, the npn type of first transistor $Q_{21}$ and the pnp type of second transistor $Q_{31}$ are arranged in series. In this case, a voltage applied to the output terminal 36 can be equalized with the direct current bias voltage V1 applied to the base of the transistor $Q_{21}$. Therefore, even though a plurality of delay circuit unit 31 is arranged in series, a voltage applied to each of the input terminal 34 can be adjusted to the direct current bias voltage V1.

Figure 10:
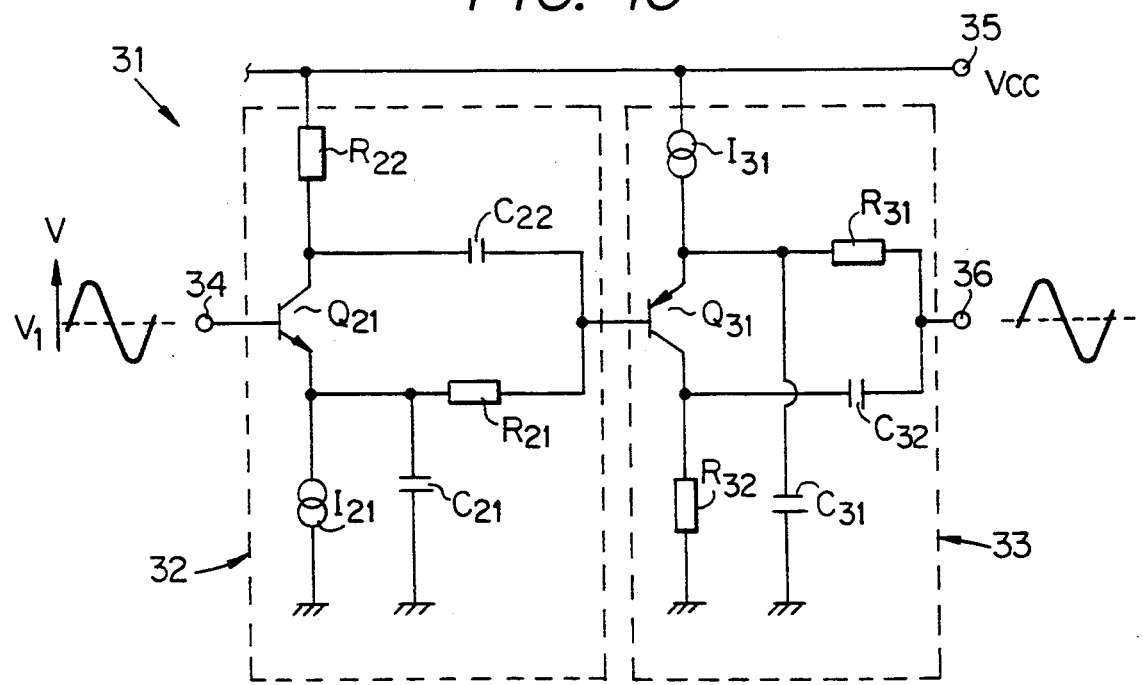
FIG. 10 is a circuit diagram according to a seventh embodiment, a low electric potential being applied to an electric source terminal.
Figure 11A:
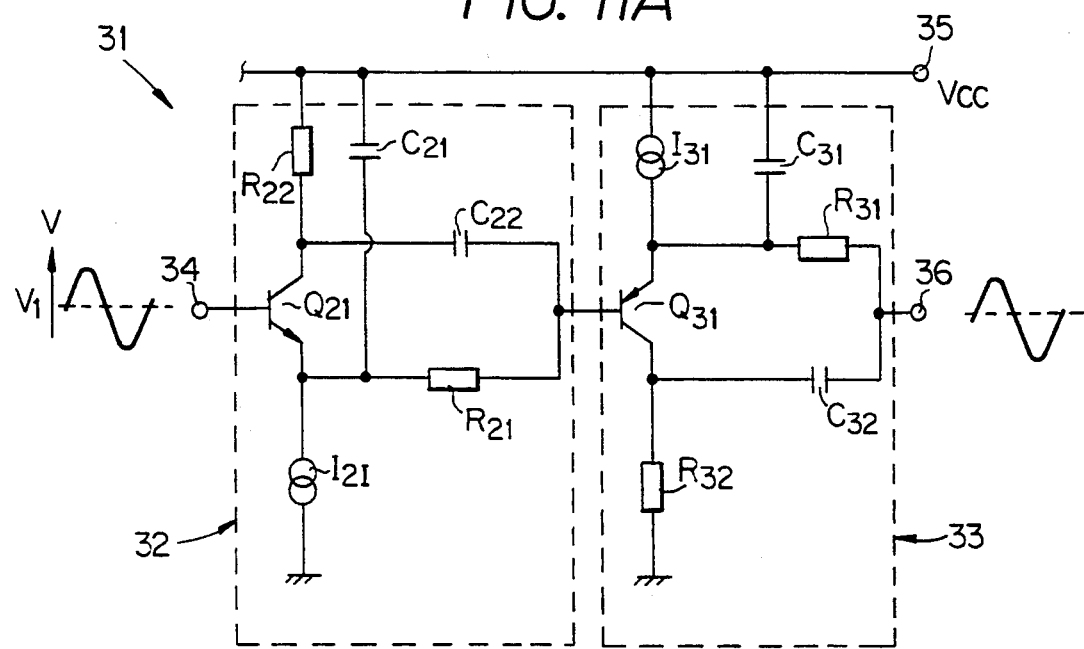
FIGS. 11A and 11B are circuit diagrams according to an eighth and a ninth embodiment, a low electric potential being applied to an electric source terminal.
Figure 11B:
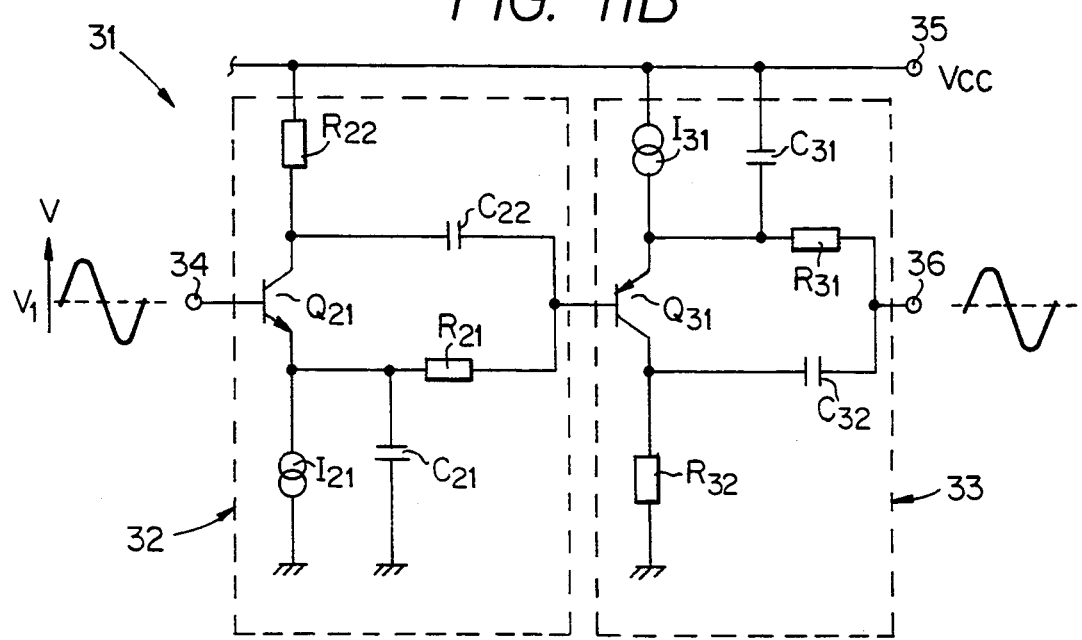
Figure 12A:
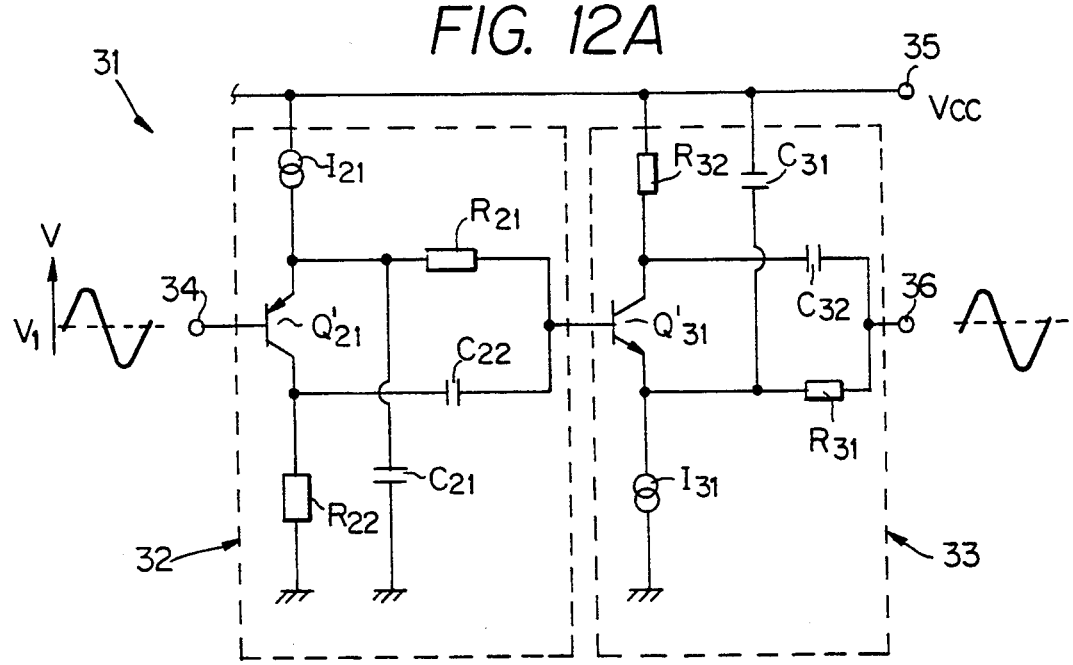
FIGS. 12A-12D are circuit diagrams according to a tenth, an eleventh, a twelfth, and a thirteenth embodiment, a low electric potential being applied to an electric source terminal.
Figure 12B:
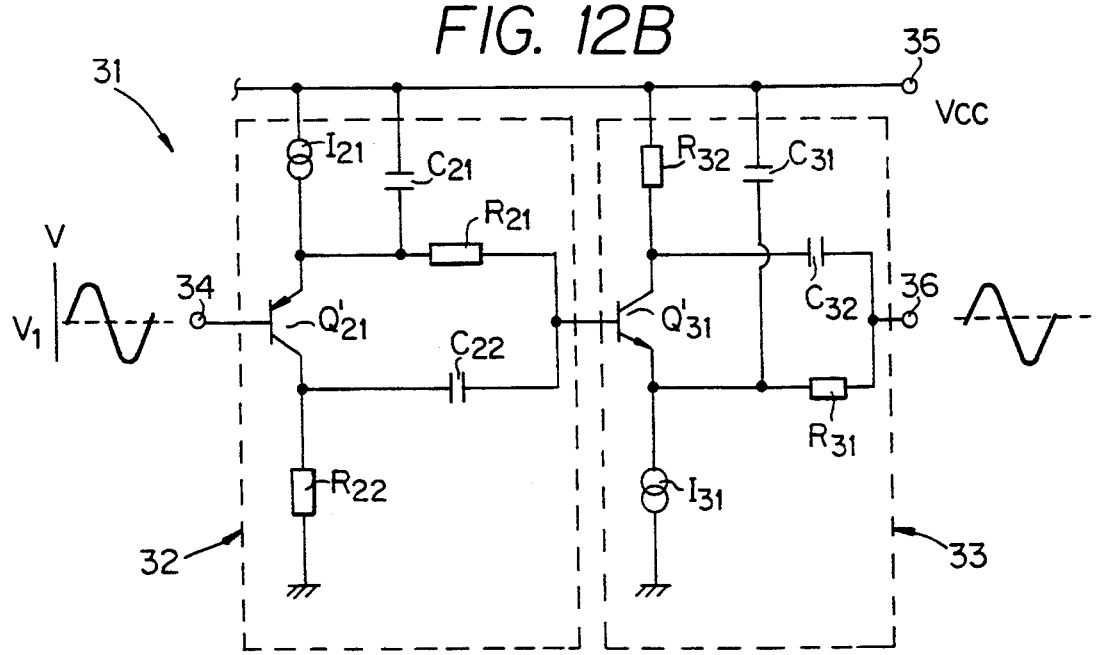
Figure 12C:
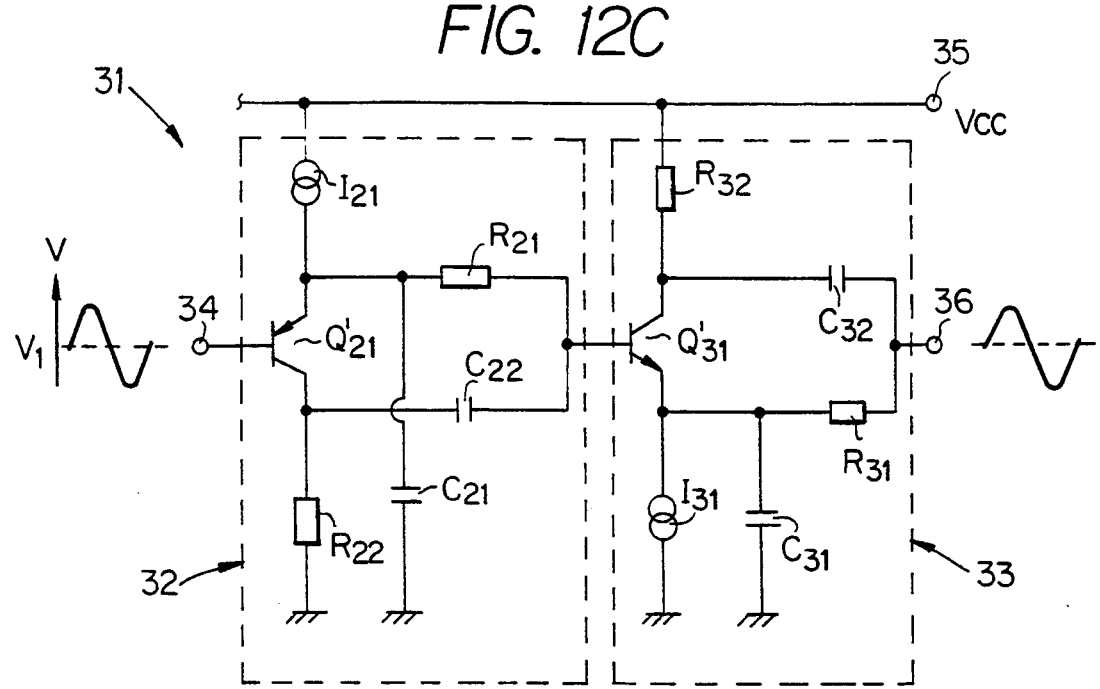
Figure 12D:
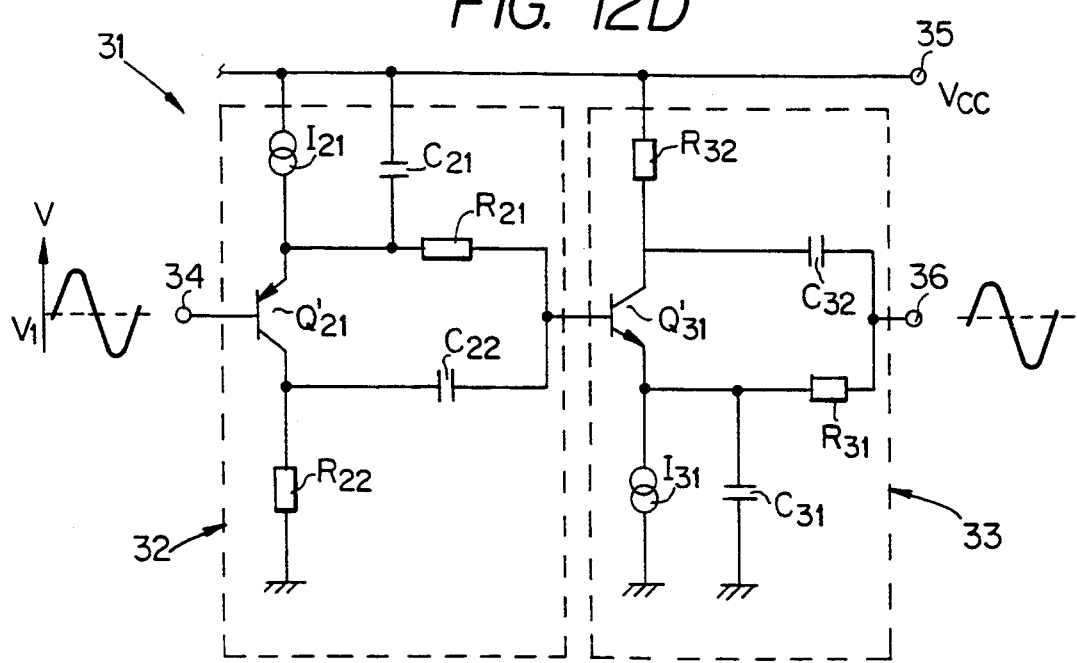

In the second embodiment, the other end of the first capacitor $C_{21}$ is connected to the electric source terminal 35. However, as shown in FIG. 10, it may also be preferred that the other end of the first capacitor $C_{21}$ be grounded in the delay circuit unit 31. Also, the other end of the third capacitor $C_{31}$ is grounded. However as shown in FIGS. 11A and 11B, it may also be preferred that the other end of the third capacitor $C_{31}$ be connected to the electric source terminal 35 of the delay circuit unit 31.

Also, as shown in FIGS. 12A and 12B, 12C and 12D, it may be preferred that a pnp type of transistor $Q_{21}$ be arranged in the first delay section 32 of the delay circuit unit 31 in place of the npn type of the first transistor $Q_{21}$, and that an npn type of transistor $Q_{31}$ be arranged in the second delay section 33 of the delay circuit unit 31 in place of the pnp type of the second transistor $Q_{31}$.

3. Third Embodiment

Next, a third embodiment is described with reference to FIG. 5.

Figure 5:
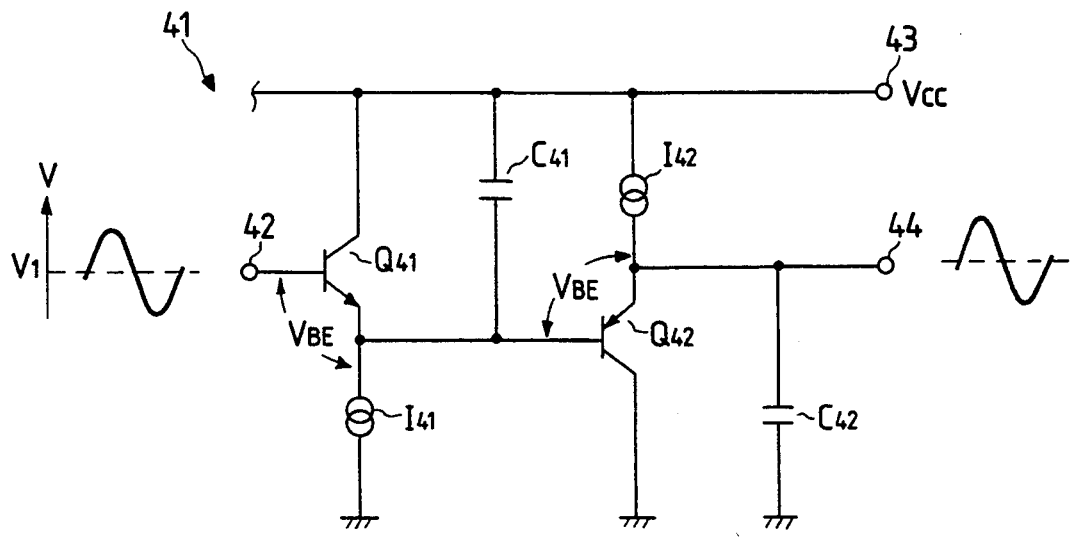
FIG. 5 is a circuit diagram of a delay circuit unit according to a third embodiment, a low electric potential being applied to an electric source terminal.

FIG. 5 is a circuit diagram of a delay circuit unit according to a third embodiment, a low electric potential being applied to an electric source terminal.

As shown in FIG. 5, a delay circuit unit 41 according to the third embodiment comprises an npn type of first transistor $Q_{41}$ of which a base is connected to an input terminal 42, a first changeable current source $I_{41}$ through which an electric current $I_3$ flows from an emitter of the transistor $Q_{41}$ to ground, a first capacitor $C_{41}$ of which one end is connected to the emitter of the transistor $Q_{41}$ and another end is connected to an electric source terminal 43, a pnp type of second transistor $Q_{42}$ of which a base is connected to the emitter of the first transistor $Q_{41}$ and an emitter is connected to an output terminal 44, a second changeable current source $I_{42}$ through which an electric current $I_4$ flows from the electric source terminal 43 to the emitter of the transistor $Q_{42}$, and a second capacitor $C_{42}$ of which one end is connected to the emitter of the transistor $Q_{42}$ and another end is grounded.

A direct current voltage Vcc is always applied to the electric source terminal 43, and a direct current bias voltage V1 is always applied to the base of the transistor $Q_{41}$ to turn on the transistor $Q_{41}$. Also, in cases where a potential difference $V1 - V_{BE}$ between the direct current bias voltage V1 and a base-emitter potential diference $V_{BE}$ of the first transistor $Q_{41}$ is applied to the base of the second transistor $Q_{42}$, the second transistor $Q_{42}$ is turned on.

The electric current $I_3$ of the first changeable current source $I_{41}$ and the electric current $I_4$ of the second changeable current source $I_{42}$ are respectively changeable under control of a control section (not shown), as formulated by the equation (4). In cases where the electric current $I_3$ of the first changeable current source $I_{41}$ equals a value $I_o$, an emitter resistance of the transistor $Q_{42}$ equals a value $r_{eA} = kT/qI_o$. Also, in cases where the electric current $I_4$ of the second changeable current source $I_{42}$ equals the value $I_o$, an emitter resistance of the transistor $Q_{42}$ equals the value $r_{eA}$.

In the above configuration, when a sinusoidal analog signal is transferred from the input terminal 42 to the base of the transistor $Q_{41}$ as an input signal, the analog signal is amplified in the transistor $Q_{41}$ and is delayed by the function of the first capacitor $C_{41}$ before the analog signal delayed is applied to the base of the transistor $Q_{42}$ in the emitter follower configuration. Thereafter, the analog signal is again delayed by the function of the second capacitor $C_{42}$ before the analog signal delayed is output from the output terminal 44 as an output signal.

In this case, the forward current gains $h_{fe}$ of the transistors $Q_{21}$, $Q_{31}$ are large enough, and stray capacitance of the delay circuit unit 41 is small enough.

Therefore, a transfer function $H_3(\omega)$ of the delay circuit unit 41 defined as a ratio of a Laplace transformed output function $Y_3(\omega)$ of the output signal to a Laplace transformed input function $X_3(\omega)$ of the input signal is formulated by an equation (21).

$$H_3(\omega) = 1/\{(1+j\omega r_{e3}C_5)/(1+j\omega r_{e4}C_6)\} \quad (21)$$

Wherein, the symbol j denotes an imaginary number, and the symbol $\omega$ denotes an angular frequency of the analog signal, the symbol $r_{e3}$ denotes an emitter resistance of the transistor $Q_{41}$, the symbol $r_{e4}$ denotes an emitter resistance of the transistor $Q_{42}$, the symbol $C_5$ denotes a capacitance of the first capacitor $C_{41}$, and the symbol $C_6$ denotes a capacitance of the second capacitor $C_{42}$.

To simply explain features of the delay circuit unit 41, the electric current $I_3$ of the first changeable current source $I_{41}$ and the electric current $I_4$ of the second changeable current source $I_{42}$ are set to the value $I_o$, and the capacitances of the first and second capacitors $C_{41}$, $C_{42}$ are set to a common value Ca.

In this case, an amplitude characteristic function $G_3(\omega)$ indicating frequency characteristics of the amplitude of the analog signal in the delay circuit unit 41 is formulated by an equation (22).

$$G_3(\omega) = |H_3(\omega)| \qquad (22)$$
$$= 1/\{(1 + (\omega r_{eA} Ca)^2\}$$

Also, a delay time function $Td_3(\omega)$ denoting frequency characteristics of the delay time of the analog signal in the delay circuit unit 41 is determined by utilizing the equation (21).

$$Td_3(\omega) = 2r_{eA} Ca / \{1+(\omega r_{eA} Ca)^2\} \qquad (23)$$

The equation (23) is changed by utilizing the equation (4) to an equation (24).

$$Td_3(\omega) = (2Ca^* kT/qI_o) / \{1+(\omega Ca^* kT/qI_o)^2\} \qquad (24)$$

Therefore, the delay time of the analog signal can be easily changed by changing the electric current $I_o$.

Also, in cases where the delay time function $Td_3(\omega)$ is compared with the delay time function $Td_2(\omega)$ formulated by the equation (19), a first term $RC/\{1+(\omega RC)^2\}$ independent of the electric current $I_o$ does not exist in the equation (23). Therefore, the delay time of the analog signal can be changed in a wide range as compared with that in the delay circuit unit 31.

Specifically, a low band delay time $Td_3$ in a low band $(1 \gg \omega RC)$ is expressed by an equation (25).

$$Td_3 = 2r_{eA} Ca \qquad (25)$$

The equation (25) is changed by substituting the equation (4) into the equation (25).

$$Td_3 = 2Ca^* kT/qI_o \qquad (26)$$

Therefore, the electric current $I_o$ is inversely proportion to the delay time of the analog signal in the low band. Accordingly, the variation of the electric current $I_0$ directly influences on the delay time of the analog signal in the low band.

A cut off frequency Fc in the delay circuit unit 41 is approximately expressed by an equation (27).

$$Fc = 1/(2\pi^* r_{eA}^* Ca) \qquad (27)$$

The emitter resistance $r_{eA}$ can be small by increasing the electric current $I_o$. Therefore, the amplitude of the analog signal output from the output terminal 44 can be maintained at a prescribed value in a wide angular frequency range in cases where the emitter resistance $r_{eA}$ is minimized. In this case, the delay time of the analog signal expressed by the equation (23) is shortened.

Figure 13:
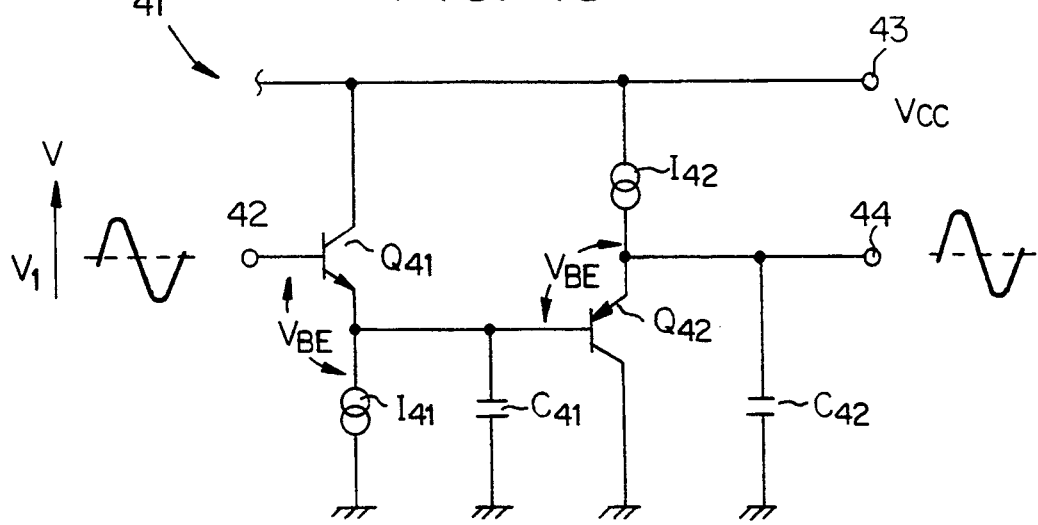
FIG. 13 is a circuit diagram according to a fourteenth embodiment, a low electric potential being applied to an electric source terminal.
Figure 14A:
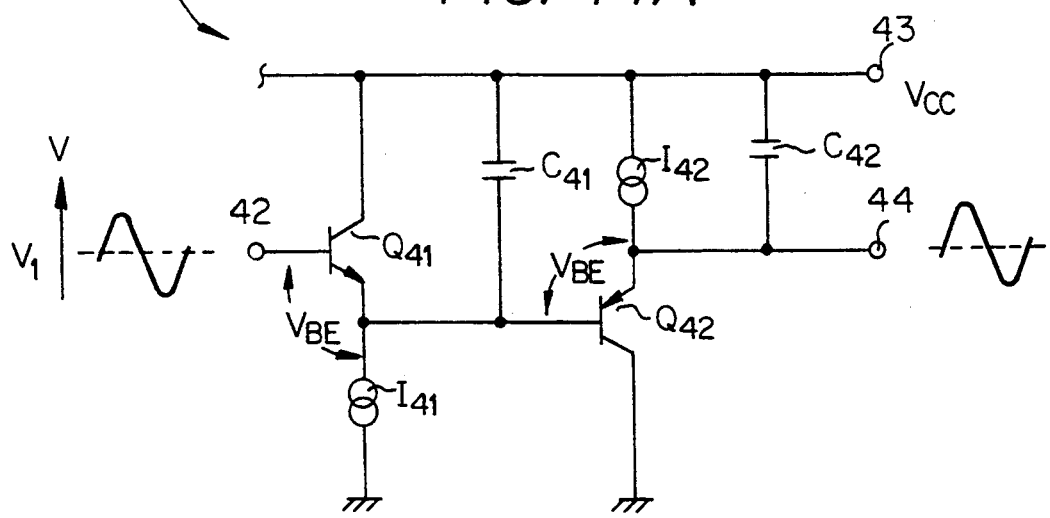
FIG. 14A and 14B are circuit diagrams according to a fifteenth embodiment, a low electric potential being applied to an electric source terminal.
Figure 14B:
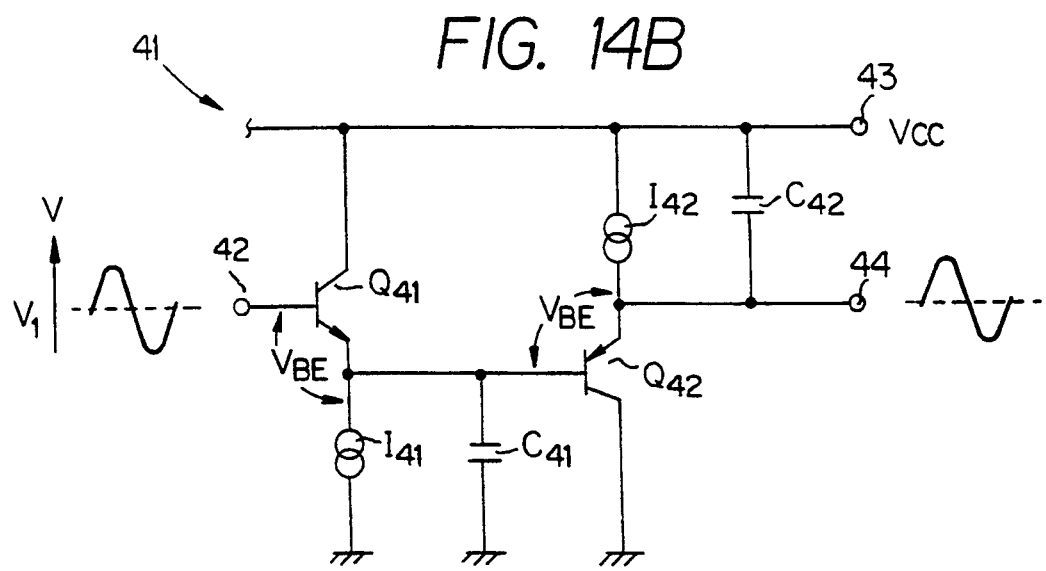
Figure 15A:
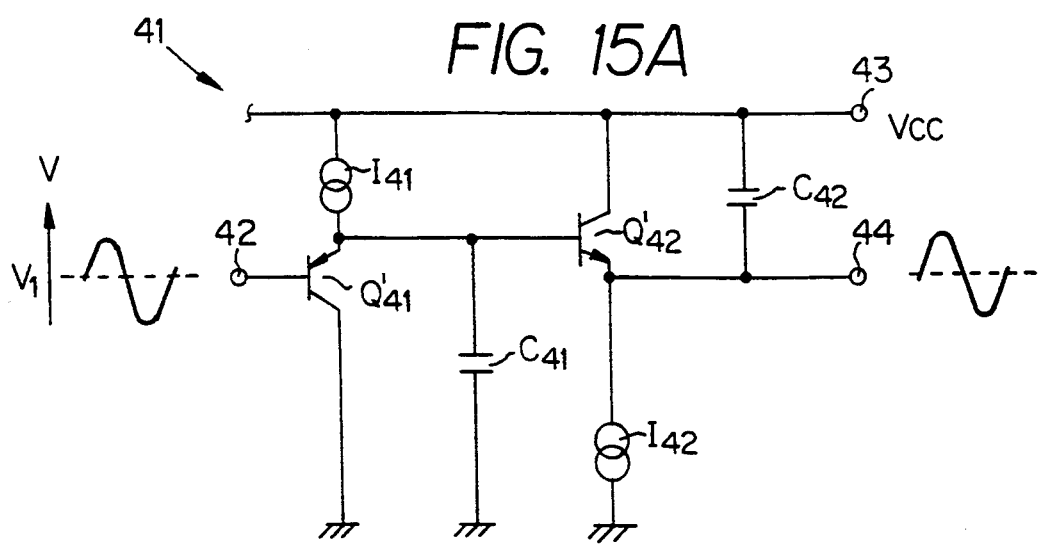
FIGS. 15A-15D are circuit diagrams according to sixteenth through nineteenth embodiments, a low electric potential being applied to an electric source terminal.
Figure 15B:
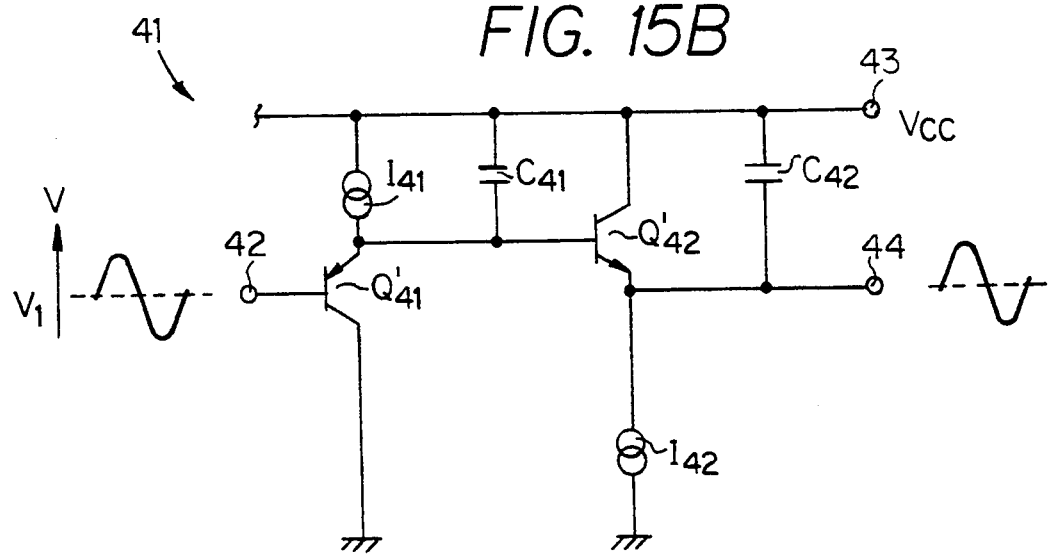
Figure 15C:
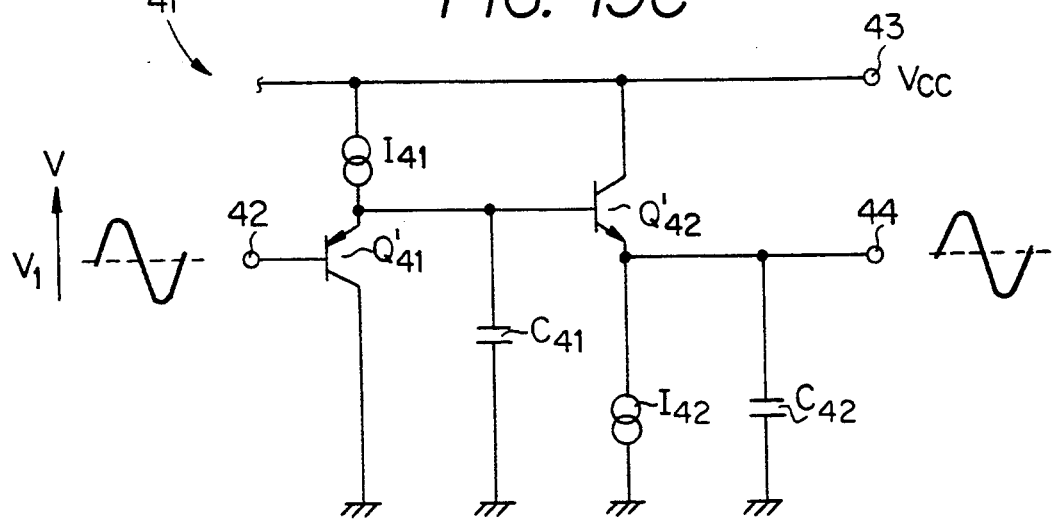
Figure 15D:
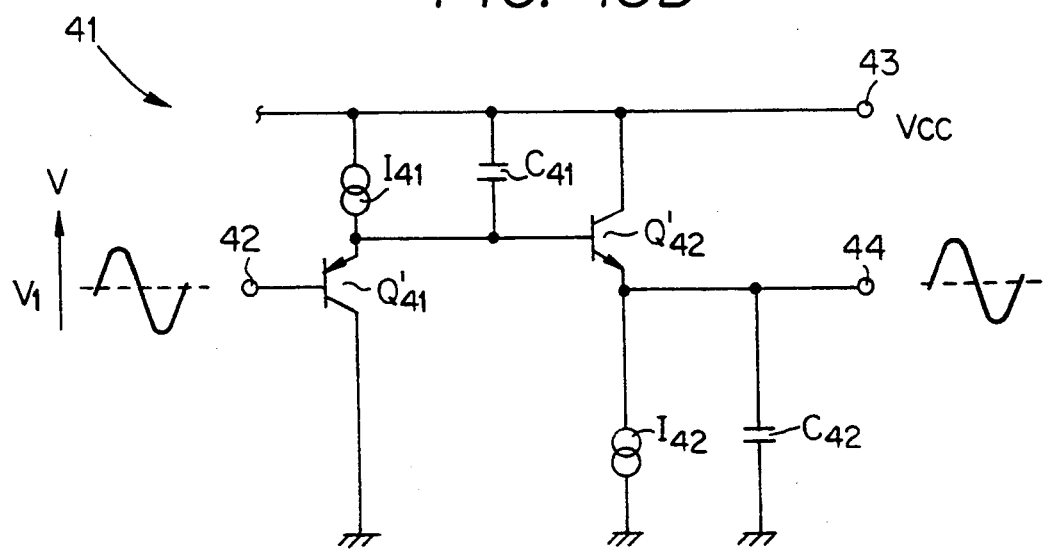

In the third embodiment, the other end of the first capacitor $C_{41}$ is connected to the electric source terminal 43. However, as shown in FIG. 13, it is may be preferred that the other end of the first capacitor $C_{41}$ be grounded in the delay circuit unit 41. Also, the other end of the second capacitor $C_{42}$ is grounded. However, as shown in FIGS. 14A and 14B, it may be preferred that the other end of the second capacitor $C_{42}$ be connected to the electric source terminal of the delay circuit unit 41 43.

Also, as shown in FIGS. 15A, 15B, 15C and 15D, it may be preferred that a pnp type of transistor $Q_{41}$ be arranged in the delay circuit unit 41 in place of the npn type of the first transistor $Q_{41}$, and that an npn type of transistor $Q_{42}$ be arranged in the delay circuit unit 41 in place of the pnp type of the second transistor $Q_{42}$.

Next, an allowed range of the direct current voltage Vcc applied to the electric source terminal 43 is described.

In cases where a first base-emitter potential difference $V_{BE1}$ between the base of the transistor $Q_{41}$ and the emitter of the transistor $Q_{41}$ equals a second base-emitter potential difference $V_{BE2}$ between the base of the transistor $Q_{42}$ and the emitter of the transistor $Q_{42}$ (a first condition), a direct current voltage V2 applied to the output terminal 44 equals the direct current bias voltage V1 applied to the base of the transistor $Q_{41}$.

Also, a third potential difference $VQ_{41}$ of the transistor $Q_{41}$ is a potential difference $V1 - V_{BE1}$ between one end of the changeable current source $I_{41}$ connected to the emitter of the transistor $Q_{41}$ and the ground. A fourth potential difference $VQ_{42}$ of the transistor $Q_{42}$ is a potential difference $Vcc - V1$ between one end of the changeable current source $I_{42}$ connected to the emitter of the transistor $Q_{42}$ and the electric source terminal 43. Therefore, in cases where the third potential difference $VQ_{41}$ ($VQ_{41} = V1 - V_{BE1}$) of the transistor $Q_{41}$ equals the fourth potential difference $VQ_{42}$ ($VQ_{42} = Vcc - V1$) of the transistor $Q_{42}$ (a second condition), a dynamic range of the delay circuit unit 41 is maximized.

Therefore, in cases where the potential differences $V_{BE1}$, $V_{BE2}$ are denoted by a common symbol $V_{BE}$ according to the first condition, the second condition is formulated by an equation (28).

$$V1 - V_{BE} = Vcc - V1 \qquad (28)$$

Accordingly, in cases where the direct current bias voltage V1 is set to satisfy the equation (28), the dynamic range allowed for the analog signal input to the base of the transistor $Q_{41}$ can be maximized.

Also, in cases where the changeable current sources $I_{41}$, $I_{42}$ respectively include one or more resistors, the direct current bias voltage V1 must be equal to or larger than the sum of the base-emitter potential difference $V_{BE}$, a dynamic range Vsig required for the analog signal, and a saturation voltage Vsat required for the operation of the transistors composing the changeable current sources $I_{41}$, $I_{42}$, to operate the transistors $Q_{41}$, $Q_{42}$ (a third condition). That is, the third condition is formulated by an equation (29) to operate the transistors $Q_{41}$, $Q_{42}$.

$$V1 \geq V_{BE} + Vsig + Vsat \qquad (29)$$

Therefore, the allowed range of the direct current voltage Vcc applied to the electric source terminal 43 is formulated by utilizing the equations (28), (29).

$$Vcc \geq V_{BE} + 2^*Vsig + 2^*Vsat \qquad (30)$$

That is, a minimum value Vcc(min) of the direct current voltage Vcc is formulated by an equation (31).

$$Vcc(min) = V_{BE} + 2^*Vsig + 2^*Vsat \qquad (31)$$

Accordingly, though the minimum value Vcc(min) of the direct current voltage Vcc depends on the dynamic range Vsig required for the analog signal in the delay circuit unit 41, the transistors $Q_{41}$, $Q_{42}$ can be generally operated even though the direct current voltage Vcc applied to the electric source terminal 43 is equal to or less than 2 V. Therefore, the minimum value Vcc(min) of the direct current voltage Vcc can be lower than that in the delay circuit unit 31 according to the second embodiment.

Next a comparison between features of the second embodiment and features of the third embodiment is described.

The delay time of the analog signal in the delay circuit unit 31 is proportional to a resistance-capacitance term 4reC as formulated by the equations (19), (20). In contrast, the delay time of the analog signal in the delay circuit unit 41 is proportional to another resistance-capacitance term $2re_4Ca$ as formulated by the equations (23), (25). That is, the increasing degree of the delay time in the delay circuit unit 31 is twice as large as that in the delay circuit unit 41. Because the number of changeable current sources in the delay circuit unit 31 is the same as that in the delay circuit unit 41, Therefore, the second embodiment is superior in respect to both consumed electric current and the number of transistors.

Also, the second embodiment is superior in respect to the frequency characteristics of the amplitude because the amplitude characteristic function $G_2(\omega)$ is not changed up to a high band.

However, the direct current voltage Vcc applied to the electric source terminal 43 in the third embodiment is allowed to be smaller than that in the second embodiment. Also, the third embodiment is superior in respect to the oscillation of the output signal, the generation of noise, and operational stability. That is, the delay circuit unit 41 can be easily designed as compared with the delay circuit unit 31.

4. Fourth Embodiment

Next, a fourth embodiment is described with reference to FIGS. 6, 7.

Figure 6:
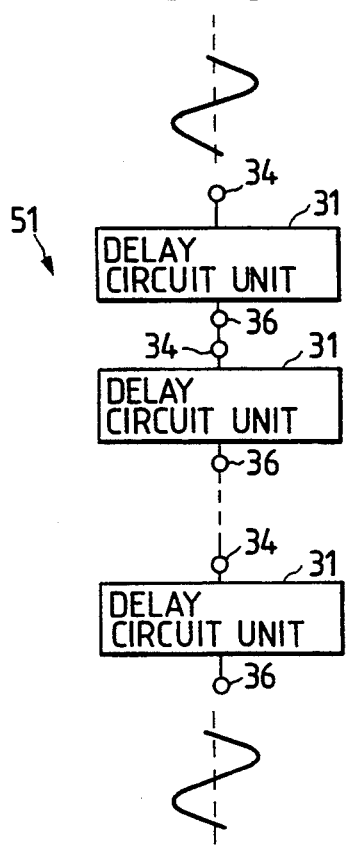
FIG. 6 is a block diagram of an n-stage delay circuit composed of a plurality of delay circuit units arranged in series.

FIG. 6 is a block diagram of an n-stage delay circuit composed of a plurality of delay circuit units 31 arranged in series.

As shown in FIG. 6, an n-stage delay circuit 51 comprises a plurality of delay circuit units 31 arranged in series.

In the n-stage delay circuit 51, a sinusoidal analog signal is transferred through the delay circuit units 31 arranged in series. In this case, the analog signal is amplified according to the amplitude characteristic function $G_2(\omega)$ formulated by the equation (18) in each of the delay circuit units 31. Also, the analog signal is changeably delayed according to the delay time function $Td_2(\omega)$ formulated by the equation (19) in each of the delay circuit units 31.

Therefore, the delay time of the analog signal can be increased in the n-stage delay circuit 51 without increasing nor decreasing the amplitude of the analog signal because the amplification of the analog signal is almost 0 dB in a wide angular frequency range as shown in FIG. 3A.

As is described in the second embodiment, because the npn type of first transistor $Q_{21}$ and the pnp type of second transistor $Q_{31}$ are arranged in series in the delay circuit unit 31, a voltage applied to each of the input terminal 34 can be adjusted to the direct current bias voltage V1. Therefore, a dynamic range can be maintained in the n-stage delay circuit 51.

Figure 7:
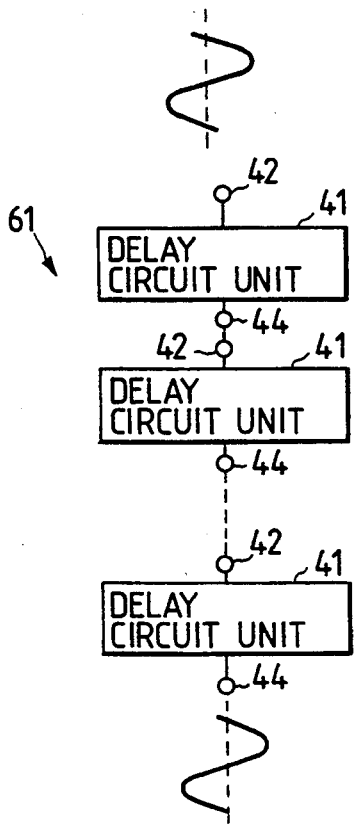
FIG. 7 is a block diagram of an n-stage delay circuit composed of a plurality of delay circuit units arranged in series.

FIG. 7 is a block diagram of an n-stage delay circuit composed of a plurality of delay circuit units 41 arranged in series.

As shown in FIG. 7, an n-stage delay circuit 61 comprises a plurality of delay circuit units 41 arranged in series.

In the n-stage delay circuit 61, a sinusoidal analog signal is transferred through the delay circuit units 41 arranged in series. In this case, the analog signal is amplified according to the amplitude characteristic function $G_3(\omega)$ formulated by the equation (22) in each of the delay circuit units 41. Also, the analog signal is changeably delayed according to the delay time function $Td_3(\omega)$ formulated by the equation (23) in each of the delay circuit units 41.

Therefore, the delay time of the analog signal can be increased in the n-stage delay circuit 61.

Also, in cases where the emitter resistance $re_4$ is reduced, the delay time of the analog signal is reduced more strongly than that in the n-stage delay circuit 51.

In addition, the delay circuit unit 41 is composed of passive elements such as resistors and capacitors, emitter follower circuits, and changeable current sources. That is, neither an amplifying circuit nor an inverting circuit is arranged in the delay circuit unit 41. Therefore, the amplitude of the analog signal is not decreased in the n-stage delay circuit 61. Also, an amplitude of any signal having a high angular frequency is reduced in the delay circuit unit 41. Therefore, even though a noise is generated in one of the delay circuit units 41, the noise is reduced in the n-stage delay circuit 61 because a frequency of the noise is generally high.

Accordingly, even though the degree of the delay time is small in each of the delay circuit units 41, a suitable delay time can be obtained in the n-stage delay circuit 61 by arranging a suitable number of delay circuit units 41 in series on condition that the frequency characteristics of the n-stage delay circuit 61 is satisfied.

Next, common effects in the n-stage delay circuit 51 and the n-stage delay circuit 61 are described.

In cases where the electric currents flowing through the changeable current sources $I_{21}$, $I_{32}$ (and $I_{41}$, $I_{42}$) are changed for each delay circuit unit 31 (and 41), a changing degree of the delay time in the n-stage delay circuit 51 (and 61) can be suitably adjusted. Also, in cases where the changing degree of the delay time is too large, the changing degree of the delay time can be reduced by fixing the electric currents flowing through the changeable current sources $I_{21}$, $I_{32}$ (and $I_{41}$, $I_{42}$) in a part of the delay circuit units 31 (and 41). In this case, a circuitry of the n-stage delay circuit 51 (and 61) can be simplified.

Also, because the n-stage delay circuit 51 (and 61) is manufactured by repeatedly arranging the delay circuit units 31 (and 41), mask design can be easily implemented. That is, a masking process is repeatedly executed according to the mask design to produce each of the delay circuit units 31 (and 41). Therefore, the n-stage delay circuit 51 (and 61) can be manufactured on a large integrated scale. That is, the n-stage delay circuit 51 (and 61) is appropriate to manufacture in an integrated circuit configuration.

Furthermore, because the n-stage delay circuit 51 (and 61) is simply manufactured by utilizing the npn type of transistors and the pnp type of transistors, the number of elements is comparatively small. Therefore, the n-stage delay circuit 51 (and 61) can be manufactured without consuming electric current so much.

Also, even though the electric potential applied to the electric source terminals is comparatively low, the transistors can be operated, and the dynamic range allowed for the analog signal is large enough.

As a practical matter, because operational characteristics of the npn type of transistors differ from those of the pnp type of transistors and because operational characteristics of the transistors differ from each other, an electric potential difference between the input signal and the output signal is generated in each of the delay circuit units 31 (and 41) in cases where the n-stage delay circuit 51 (and 61) is incorporated in an integrated circuit. As a result, the dynamic range allowed for the analog signal is undesirably limited. In addition, an electric potential difference between the input signal of a first delay circuit unit 31 (and 41) and the output signal of a final delay circuit unit 31 (and 41) is increased in proportion to the number of delay circuit units 31 (and 41).

However, the electric potential difference between the input signal and the output signal can be corrected by adding a control circuit in which the ratio of the electric current $I_1$ (and $I_3$) of the first changeable current source $I_{21}$ (and $I_{41}$) relating to the npn transistor $Q_{21}$ (and $Q_{41}$) to the electric current $I_2$ (and $I_{41}$) of the second changeable current source $I_{31}$ (and $I_{42}$) relating to the pnp transistor $Q_{31}$ (and $Q_{42}$) is controlled to reduce the electric potential difference.

Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

What is claimed is:

1. A delay circuit, comprising:
   a transistor of which a base is connected to an input terminal;
   a changeable current source through which an electric current changeably flows between an emitter of the transistor and a first reference potential point, an emitter resistance $r_e$ of the transistor being changed in dependence on the electric current;
   a first resistor of which one end is connected to the emitter of the transistor and another end is connected to an output terminal;
   a second resistor of which one end is connected to a collector of the transistor and another end is connected to a second reference potential point;
   a first capacitor of which one end is connected to the emitter of the transistor and another end is connected to one of the first or second reference potential point; and
   a second capacitor of which one end is connected to the collector of the transistor and another end is connected to the output terminal.

2. A delay circuit according to claim 1 in which a resistance ratio a, wherein a=R2/R1, of a second resistance R2 of the second resistor to a first resistance R1 of the first resistor and a capacitance ratio b, wherein b=C1/C2, of a first capacitance C1 of the first capacitor to a second capacitance C2 of the second capacitor satisfy one of two relationships $a*b=1$ and $a*b=(1+2a)^2$.

3. A delay circuit according to claim 2 in which the emitter resistance $r_e$ of the transistor, the first resistance R1 of the first resistor, and the second resistance R2 of the second resistor satisfy a relationship $r_e=R1*R2/(R1+R2)$ on condition that the electric current changeably flowing through the changeable current source equals a current value.

4. A delay circuit according to claim 1 in which the transistor is formed of an npn type of transistor.

5. A delay circuit according to claim 1 in which the transistor is formed of a pnp type of transistor.

6. A delay circuit according to claim 1 in which temperature dependence of the emitter resistance $r_e$ of the transistor is compensated in accordance with temperature characteristics of the electric current flowing through the changeable current source.

7. A delay circuit according to claim 1, wherein said another end of said first capacitor is connected to said first reference potential point.

8. A delay circuit according to claim 1, wherein said another end of said first capacitor is connected to said second reference potential point.

9. A delay circuit, comprising:
   a first transistor of which a base is connected to an input terminal;
   a first changeable current source through which a first electric current changeably flows between an emitter of the first transistor and a first reference potential point, a first emitter resistance of the first transistor being changed in dependence on the first electric current;
   a first resistor of which one end is connected to the emitter of the first transistor;
   a second resistor of which one end is connected to a collector of the first transistor and another end is connected to a second reference potential point;
   a first capacitor of which one end is connected to the emitter of the first transistor and another end is connected to one of the first or second reference potential point;
   a second capacitor of which a base is connected to both another end of the first resistor and another end of the second capacitor;
   a second changeable current source thorough which a second electric current changeably flows between an emitter of the second transistor and the second reference potential point, a second emitter resistance of the second transistor being changed in dependence on the second electric current;
   a third resistor of which one end is connected to the emitter of the second transistor and another end is connected to an output terminal;
   a fourth resistor of which one end is connected to a collector of the second transistor and another end is connected to the first reference potential point;
   a third capacitor of which one end is connected to the emitter of the second transistor and another end is connected to one of the first or second reference potential point; and
   a fourth capacitor of which one end is connected to the collector of the second transistor and another end is connected to the output terminal.

10. A delay circuit according to claim 9 in which the first transistor is formed of an npn type of transistor, and the second transistor is formed of a pnp type of transistor.

11. A delay circuit according to claim 9 in which the first transistor is formed of a pnp type of transistor, and the second transistor is formed of an npn type of transistor.

12. A delay circuit according to claim 9, in which both the first emitter resistance of the first transistor and the second emitter resistance of the second transistor are set to a common emitter resistance value $r_{eA}$ by adjusting the first and second electric currents of the first and second changeable current sources, four resistances of the first, second, third and fourth resistors are set to a common resistance value R, and four capacitances of the first, second, third and fourth capacitors are set to a common capacitance value.

13. A delay circuit according to claim 12 in which a relationship between the common resistance value R and the common emitter resistance value $r_{eA}$ is formulated by an equation $R=2*r_{ea}$ on condition that the first electric current changeably flowing through the first changeable current source equals a current value and the second electric current changeably flowing through the second changeable current source equals another current value.

14. A delay circuit according to claim 9 in which temperature dependence of the first emitter resistance of the first transistor is compensated in accordance with temperature characteristics of the first electric current flowing through the first changeable current source, and temperature dependence of the second emitter resistance of the second transistor is compensated in accordance with temperature characteristics of the second electric current flowing through the second changeable current source.

15. A delay circuit according to claim 9, wherein said another end of said first capacitor is connected to said first reference potential point.

16. A delay circuit according to claim 9, wherein said another end of said first capacitor is connected to said second reference potential point.

17. A delay circuit according to claim 9, wherein said another end of said third capacitor is connected to said first reference potential point.

18. A delay circuit according to claim 9, wherein said another end of said third capacitor is connected to said second reference potential point.

19. A delay circuit, comprising:
- a first transistor of which a base is connected to an input terminal and a collector is connected to a first reference potential point;
- a first changeable current source through which a first electric current changeable flows between an emitter of the first transistor and a second reference potential point, a first emitter resistance of the first transistor being changed in dependence on the first electric current;
- a first capacitor of which one end is connected to the emitter of the first transistor and another end is connected to one of the first or second reference potential point;
- a second transistor of which a base is connected to the emitter of the first transistor, a collector is connected to the second reference potential point, and an emitter is connected to an output terminal;
- a second changeable current source through which a second electric current changeably flows between an emitter of the second transistor and the first reference potential point, a second emitter resistance of the second transistor being changed in dependence on the second electric current; and
- a second capacitor of which one end is connected to the emitter of the second transistor and another end is connected to one of the first or second reference potential point.

20. A delay circuit according to claim 19 in which the first transistor is formed of an npn type of transistor, and the second transistor is formed of a pnp type of transistor.

21. A delay circuit according to claim 19 in which the first transistor is formed of a pnp type of transistor, and the second transistor is formed of an npn type of transistor.

22. A delay circuit according to claim 19 in which the first and second electric currents of the first and second changeable current sources are adjusted to set both the first emitter resistance of the first transistor and the second emitter resistance of the second transistor to a common emitter resistance value, and capacitances of the first and second capacitors are set to a common capacitance value.

23. A delay circuit according to claim 19 in which a direct current bias voltage V1 applied to the input terminal is adjusted to equalize a first potential difference between the emitter of the first transistor and the second reference potential point to a second potential difference between the emitter of the second transistor and the first reference potential point.

24. A delay circuit according to claim 19 in which temperature dependence of the first emitter resistance of the first transistor is compensated in accordance with temperature characteristics of the first electric current flowing through the first changeable current source, and temperature dependence of the second emitter resistance of the second transistor is compensated in accordance with temperature characteristics of the second electric current flowing through the second changeable current source.

25. A delay circuit according to claim 19, wherein said another end of said first capacitor is connected to said first reference potential point.

26. A delay circuit according to claim 19, wherein said another end of said first capacitor is connected to said second reference potential point.

27. A delay circuit according to claim 19, wherein said another end of said second capacitor is connected to said first reference potential point.

28. A delay circuit according to claim 19, wherein said another end of said second capacitor is connected to said second reference potential point.

29. A multi-stage delay circuit comprising a plurality of delay circuit units arranged in series, each of the delay circuit units comprising:
- a first transistor of which a base is connected to an input terminal, the input terminal being connected to a preceding delay circuit unit, whereby an analog signal is applied to an input terminal of a first delay circuit unit in the series of delay circuit units;
- a first changeable current source through which a first electric current changeably flows between an emitter of the first transistor and a first reference potential point, a first emitter resistance of the first transistor being changed in dependence on the first electric current;
- a first resistor of which one end is connected to the emitter of the first transistor;
- a second resistor of which one end is connected to a collector of the first transistor and another end is connected to a second reference potential point;
- a first capacitor of which one end is connected to the emitter of the first transistor and another end is connected to either the first reference potential point or the second reference potential point;

a second capacitor of which one end is connected to the collector of the first transistor;

a second transistor of which a base is connected to both another end of the first resistor and another end of the second capacitor;

a second changeable current source through which a second electric current changeably flows between an emitter of the second transistor and the second reference potential point, a second emitter resistance of the second transistor being changed in dependence on the second electric current;

a third resistor of which one end is connected to the emitter of the second transistor and another end is connected to an output terminal, the output terminal being connected to an input terminal of a succeeding delay circuit unit, and the analog signal being output from an output terminal of a last delay circuit unit in the series of delay circuits units;

a fourth resistor of which one end is connected to a collector of the second transistor and another end is connected to the first reference potential point;

a third capacitor of which one end is connected to the emitter of the second transistor and another end is connected to either the first reference potential point or the second reference potential point; and a fourth capacitor of which one end is connected to the collector of the second transistor and another end is connected to the output terminal.

30. A circuit according to claim 29 in which a ratio of the first electric current of the first changeable current source to the second electric current of the second changeable current source is controlled to reduce an electric potential difference between the input terminal and the output terminal.

31. A multi-stage delay circuit comprising a plurality of delay circuit units arranged in series, each of the delay circuit units comprising;

a first transistor of which a base is connected to an input terminal and a collector is connected to a first reference potential point, the input terminal being connected to a preceeding delay circuit unit, whereby an analog signal is applied to an input terminal of a first delay circuit unit in the series of delay circuit units;

a first changeable current source through which a first electric current changeably flows between an emitter of the first transistor and a second reference potential point, a first emitter resistance of the first transistor being changed in dependence on the first electric current;

a first capacitor of which one end is connected to the emitter of the first transistor and another end is connected to either the first reference potential point or the second reference potential point;

a second transistor of which a base is connected to the emitter of the first transistor, a collector is connected to the second reference potential point, and an emitter is connected to an output terminal, the output terminal being connected to an input terminal of a succeeding delay circuit unit, and the analog signal being output from an output terminal of a last delay circuit unit in the series of delay circuit units;

a second changeable current source through which a second electric current changeably flows between an emitter of the second transistor and the first reference potential point, a second emitter resistance of the second transistor being changed in dependence on the second electric current; and a second capacitor of which one end is connected to the emitter of the second transistor and another end is connected to either the first reference potential point or the second reference potential point.

32. A circuit according to claim 31 in which a ratio of the first electric current of the first changeable current source to the second electric current of the second changeable current source is controlled to reduce an electric potential difference between the input terminal and the output terminal.

* * * * *